United States Patent
Santos et al.

(10) Patent No.: US 11,775,701 B2
(45) Date of Patent: *Oct. 3, 2023

(54) SYSTEM AND METHOD OF SCANNING AN ENVIRONMENT AND GENERATING TWO DIMENSIONAL IMAGES OF THE ENVIRONMENT

(71) Applicant: FARO Technologies, Inc., Lake Mary, FL (US)

(72) Inventors: Joao Santos, Korntal-Münchingen (DE); Aleksej Frank, Stuttgart (DE); Ahmad Ramadneh, Kornwestheim (DE); Simon Raab, Santa Barbara, CA (US); Oliver Zweigle, Stuttgart (DE); Derik J. White, Beaverton, OR (US)

(73) Assignee: FARO Technologies, Inc., Lake Mary, FL (US)

( * ) Notice: Subject to any disclaimer, the term of this patent is extended or adjusted under 35 U.S.C. 154(b) by 562 days.

This patent is subject to a terminal disclaimer.

(21) Appl. No.: 17/001,034

(22) Filed: Aug. 24, 2020

(65) Prior Publication Data
US 2020/0387644 A1    Dec. 10, 2020

Related U.S. Application Data

(63) Continuation of application No. 15/713,931, filed on Sep. 25, 2017, now Pat. No. 10,824,773.
(Continued)

(51) Int. Cl.
*G06F 30/13* (2020.01)
*G01C 3/08* (2006.01)
(Continued)

(52) U.S. Cl.
CPC .......... *G06F 30/13* (2020.01); *G01B 11/2518* (2013.01); *G01C 3/08* (2013.01);
(Continued)

(58) Field of Classification Search
CPC ..... G06F 30/00; G06F 30/13; G01B 11/2518; G01C 3/08; G01C 15/008; G01C 21/1656;
(Continued)

(56) References Cited

U.S. PATENT DOCUMENTS 6,246,468 B1    6/2001   Dimsdale
6,542,249 B1    4/2003   Kofman et al.
(Continued)

FOREIGN PATENT DOCUMENTS

DE    102009035336 A1    11/2010
DE    102012109481 A1    4/2014
(Continued)

OTHER PUBLICATIONS

Wen, Chenglu et al., "Three-Dimensional Indoor Mobile Mapping with Fusion of Two-Dimensional Laser Scanner and RGB-D Camera Data", Apr. 2014, IEEE Geoscience and Remote Sensing Letters, vol. 11, No. 4,IEEE. (Year: 2014).*
(Continued)

*Primary Examiner* — Cedric Johnson
(74) *Attorney, Agent, or Firm* — McCarter & English, LLP; Dave S. Christensen

(57) ABSTRACT

Systems and methods of generating two-dimensional (2D) images of an environment are provided. The systems includes a measurement device and a processor configured to generate a 2D image of an environment based at least in part on a number of 2D scans, a first translation value, a first translation direction, a second translation value, a second translation direction, a first rotation value, and a second rotation value. Generating the 2D image further includes generating a grid map that includes a plurality of cells, each of the plurality of cells indicating a probability of a cell area being occupied.

13 Claims, 27 Drawing Sheets

Related U.S. Application Data

(60) Provisional application No. 62/477,667, filed on Mar. 28, 2017.

(51) Int. Cl.

| | | |
|---|---|---|
| G01C 15/00 | (2006.01) | |
| G01S 17/89 | (2020.01) | |
| G01S 7/48 | (2006.01) | |
| G01S 17/42 | (2006.01) | |
| G01S 17/87 | (2020.01) | |
| G01S 17/86 | (2020.01) | |
| G01C 21/16 | (2006.01) | |
| G01B 11/25 | (2006.01) | |
| G09B 25/04 | (2006.01) | |
| G06T 11/60 | (2006.01) | |

(52) U.S. Cl.
CPC ....... *G01C 15/008* (2013.01); *G01C 21/1656* (2020.08); *G01S 7/4808* (2013.01); *G01S 17/42* (2013.01); *G01S 17/86* (2020.01); *G01S 17/87* (2013.01); *G01S 17/89* (2013.01); *G09B 25/04* (2013.01); *G06T 11/60* (2013.01)

(58) Field of Classification Search
CPC ..... G01C 21/165; G01S 7/4808; G01S 17/42; G01S 17/86; G01S 17/87; G01S 17/89; G09B 25/04; G06T 11/60
USPC .......................................................... 703/1
See application file for complete search history.

(56) References Cited

U.S. PATENT DOCUMENTS

| | | |
|---|---|---|
| 7,069,124 B1 | 6/2006 | Whittaker et al. |
| 8,384,914 B2 | 2/2013 | Becker et al. |
| 8,625,106 B2 | 1/2014 | Ossig et al. |
| 8,699,007 B2 | 4/2014 | Becker et al. |
| 8,699,036 B2 | 4/2014 | Ditte et al. |
| 8,705,012 B2 | 4/2014 | Greiner et al. |
| 8,705,016 B2 | 4/2014 | Schumann et al. |
| 8,730,477 B2 | 5/2014 | Ruhland et al. |
| 8,811,767 B2 | 8/2014 | Veeraraghavan et al. |
| 8,830,485 B2 | 9/2014 | Woloschyn |
| 8,896,819 B2 | 11/2014 | Schumann et al. |
| 8,970,823 B2 | 3/2015 | Heidemann et al. |
| 9,074,883 B2 | 7/2015 | Schumann et al. |
| 9,279,662 B2 | 3/2016 | Steffey et al. |
| 9,329,271 B2 | 5/2016 | Ossig et al. |
| 9,342,890 B2 | 5/2016 | Becker et al. |
| 9,372,265 B2 | 6/2016 | Zweigle et al. |
| 9,417,316 B2 | 8/2016 | Schumann et al. |
| 9,513,107 B2 | 12/2016 | Zweigle et al. |
| 9,599,455 B2 | 3/2017 | Heidemann et al. |
| 9,618,620 B2 | 4/2017 | Zweigle et al. |
| 9,739,886 B2 | 8/2017 | Zweigle et al. |
| 9,746,559 B2 | 8/2017 | Zweigle et al. |
| 2004/0027347 A1 | 2/2004 | Farsaie |
| 2006/0110026 A1 | 5/2006 | Strassenburg-Kleciak |
| 2009/0323121 A1 | 12/2009 | Valkenburg et al. |
| 2010/0134596 A1 | 6/2010 | Becker |
| 2011/0288684 A1 | 11/2011 | Farlow et al. |
| 2012/0069352 A1 | 3/2012 | Ossig et al. |
| 2014/0016114 A1 | 1/2014 | Lopez et al. |
| 2014/0063489 A1 | 3/2014 | Steffey et al. |
| 2014/0078519 A1 | 3/2014 | Steffey et al. |
| 2014/0226190 A1 | 8/2014 | Bridges et al. |
| 2014/0240690 A1 | 8/2014 | Newman et al. |
| 2014/0300906 A1 | 10/2014 | Becker et al. |
| 2014/0362424 A1 | 12/2014 | Bridges et al. |
| 2015/0085068 A1 | 3/2015 | Becker et al. |
| 2015/0085301 A1 | 3/2015 | Becker et al. |
| 2015/0160342 A1* | 6/2015 | Zweigle ............... G01B 11/002 356/5.01 |
| 2015/0160347 A1 | 6/2015 | Zweigle et al. |
| 2016/0047914 A1 | 2/2016 | Zweigle et al. |
| 2016/0282107 A1* | 9/2016 | Roland .................. G01B 11/24 |
| 2018/0285482 A1 | 10/2018 | Santos et al. |

FOREIGN PATENT DOCUMENTS

| | | |
|---|---|---|
| WO | 2013103725 A1 | 7/2013 |
| WO | 2014128498 A2 | 8/2014 |

OTHER PUBLICATIONS

Ye, Can et al. ("Navigating a Portable Robotic Device by a 3D Imaging Sensor", 2010, IEEE Sensors 2010 Conference, IEEE. (Year: 2010).*

Froehlich, M. et al., "Handheld Simultaneous Localization and Mapping Devices for 3D Scanning", 2016, 33rd International Symposium on Automation and Robotics in Construction, ISARC 2016. (Year: 2016).*

Omar, Tarek et al., "Data Acquisition Technologies for Construction Progress Tracking", Jun. 26, 2016, Automation in Construction 70, Elsevier B.V. (Year: 2016).*

Brenneke, C. et al: "Using 3D Laser Range Data for SLAM in Outdoor Environments"; Proceedings of the 2003 IEEE/RSJ International Conference on Intelligent Robots and Systems; Las Vegas, NV; Oct. 27-31, 2003; vol. 1; p. 188-193.

Censi, A., "An ICP variant using a point-to-line metric," IEEE International Conference on Robotics and Automation (ICRA) 2008. 7 pages.

Davidson, A. et al., "MonoSLAM: Real-Time Single Camera SLAM", IEEE Transactions on Pattern Analysis and Machine Intelligence, vol. 29, No. 6, Jun. 1, 2007, pp. 1052-1067, XP011179664.

Froehlich, M. et al., "Handheld Simultaneous Localization and Mapping Devices for 3D Scanning", 2016, 33rd International Symposium on Automation and Robotics in Construction (ISARC). (Year: 2016).

Gebre, Biruk A., et al., "Remotely Operated and Autonomous Mapping System (ROAMS)", Technologies for Practical Robot Applications, TEPRA 2009, IEEE International Conference on Nov. 9, 2009, pp. 173-178, XP031570394.

Harrison A. et al., "High Quality 3D Laser Ranging Under General Vehicle Motion", 2008 IEEE International Conference on Robotics and Automation, May 19-23, 2008, pp. 7-12, XP031340123.

May, S. et al., "Robust 3D-Mapping with Time-of-Flight Cameras", Intelligent Robots and Systems, IROS 2009, IEEE/RSJ International Conference on Oct. 10, 2009, pp. 1673-1678, XP031581042.

Ohno, K. et al., "Real-Time Robot Trajectory Estimation and 3D Map Construction Using 3D Camera", Intelligent Robots and Systems, 2006 IEEE/RSJ International Conference on Oct. 1, 2006, pp. 5279-5285, XP031006974.

Surmann, H. et al., "An Autonomous Mobile Robot with a 3D Laser Range Finder for 3D Exploration and Digitalization of Indoor Environments", Robotics and Autonomous Systems, Elsevier Science Publishers, vol. 45, No. 3-4, Dec. 31, 2003, pp. 181-198.

Wen, Chenglu et al., "Three-Dimensional Indoor Mobile Mapping With Fusion of Two-Dimensional Laser Scanner and RGB-D Camera Data" IEEE Geoscience and Remote Sensing Letters, vol. 11, No. 4, Apr. 2014; pp. 843-847.

Yan, R., et al., "3D Point Cloud Map Construction Based on Line Segments with Two Mutually Perpendicular Laser Sensors", 2013 13th International Conference on Control, Automation and Systems (ICCAS 2013), IEEE, Oct. 20, 2013, pp. 1114-1116.

Ye, C. et al., "Characterization of a 2-D Laser Scanner for Mobile Robot Obstacle Negotiation" Proceedings / 2002 IEEE International Conference on Robotics and Automation, May 11-15, 2002, Washington, D.C., May 1, 2002, pp. 212-2518, XP009169742.

Ye, Can, "Navigating a Portable Robotic Device by a 3D Imaging Sensor," 2010, IEEE Sensors 2010 Conference, IEEE. (Year: 2010) pp. 1005-1010.

* cited by examiner

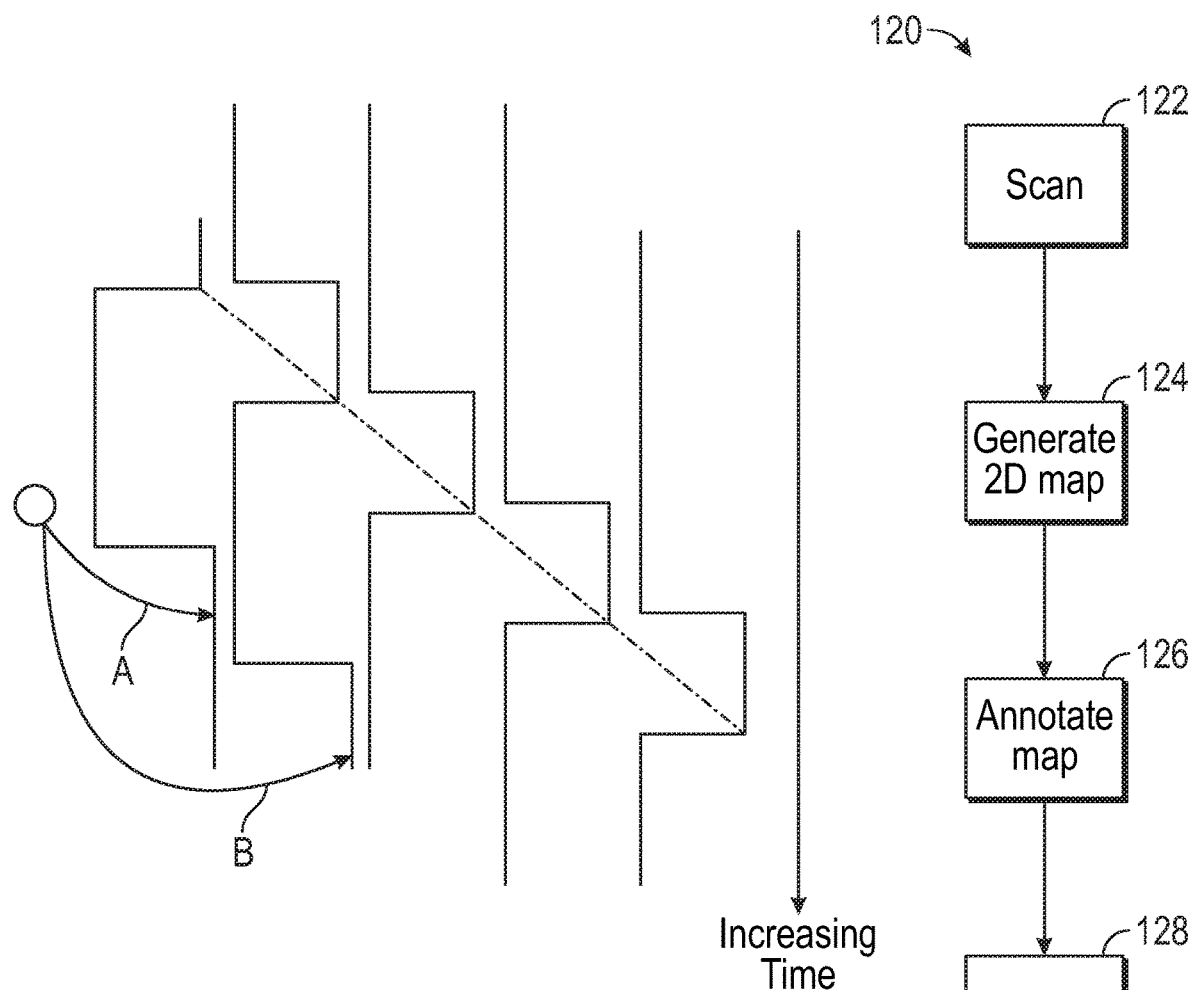

SYSTEM AND METHOD OF SCANNING AN ENVIRONMENT AND GENERATING TWO DIMENSIONAL IMAGES OF THE ENVIRONMENT

CROSS-REFERENCE TO RELATED APPLICATIONS

The present application is a Continuation Application of the legally related U.S. application Ser. No. 15/713,931, filed Sep. 25, 2017, which claims priority to U.S. Provisional Application Ser. No. 62/477,667, filed Mar. 28, 2017, the contents of such priority applications are incorporated by reference herein in their entireties.

BACKGROUND

The present application is directed to a system that optically scans an environment, such as a building, and in particular to a portable system that generates two-dimensional floorplans of the scanned environment.

The automated creation of digital two-dimensional floorplans for existing structures is desirable as it allows the size and shape of the environment to be used in many processes. For example, a floorplan may be desirable to allow construction drawings to be prepared during a renovation. Such floorplans may find other uses such as in documenting a building for a fire department or to document a crime scene.

Existing measurement systems typically use a scanning device that determines coordinates of surfaces in the environment by either emitting a light and capturing a reflection to determine a distance or by triangulation using cameras. These scanning devices are mounted to a movable structure, such as a cart, and moved through the building to generate a digital representation of the building. These systems tend to be more complex and require specialized personnel to perform the scan. Further, the scanning equipment including the movable structure may be bulky, which could further delay the scanning process in time sensitive situations, such as a crime or accident scene investigation.

Accordingly, while existing scanners are suitable for their intended purposes, what is needed is a system for having certain features of embodiments of the present invention.

BRIEF DESCRIPTION

According to some embodiments, systems for generating two-dimensional (2D) images of environments are provided. The systems include a measurement device configured to be moved to a plurality of registration positions in the environment, the measurement device having a 2D scanner and is sized and weighted to be carried by a single operator, the 2D scanner being configured to sweep a beam of light in a horizontal plane, wherein the plurality of registration positions includes a first registration position and a second registration position. The measurement device is configured to obtain a first plurality of 2D scan sets using the 2D scanner while the measurement device moves from the first registration position to the second registration position, each of the first plurality of 2D scan sets being a set of 2D coordinates of points in the environment, each of the first plurality of 2D scan sets being collected by the 2D scanner at a different position relative to the first registration position. The measurement device is configured to determine a first translation value corresponding to a first translation direction, a second translation value corresponding to a second translation direction, a first rotation value corresponding to a first orientational axis, and a second rotation value corresponding to a second orientational axis, wherein the first translation value, the second translation value, the first rotation value, and the second rotation value are determined based at least in part on a determination of a change in movement or orientation of the measurement device. A processor is configured to generate a 2D image of the environment based at least in part on the plurality of 2D scans, the first translation value, the first translation direction, the second translation value, the second translation direction, the first rotation value, and the second rotation value, wherein generating the 2D image includes generating a grid map that includes a plurality of cells, each of the plurality of cells indicating a probability of a cell area being occupied.

In addition to one or more of the features described above, or as an alternative, further embodiments of the systems may include that the measurement device comprises a housing having a body and a handle, the body having a first plane extending therethrough.

In addition to one or more of the features described above, or as an alternative, further embodiments of the systems may include that the 2D scanner comprises a light source, an image sensor, and a controller, wherein the light source is configured to steer a beam of light within the first plane to illuminate object points in the environment, wherein the image sensor is configured to receive light reflected from the object points, and wherein the controller is configured to determine a distance value to at least one of the object points.

In addition to one or more of the features described above, or as an alternative, further embodiments of the systems may include a portable computing device having a second image sensor, the portable computing device configured to communicate with the processor, wherein the processor is configured to merge a first image from the portable computing device into the 2D image of the environment in response to the image being acquired by the second image sensor, wherein a first position of the first image on the 2D image corresponding a second position in the environment where the first image is acquired.

In addition to one or more of the features described above, or as an alternative, further embodiments of the systems may include a haptic feedback device disposed within the handle and configured to generate haptic feedback in response to a signal indicating an orientation of the measurement device has crossed a variance threshold.

In addition to one or more of the features described above, or as an alternative, further embodiments of the systems may include a laser projector coupled to the measurement device, the laser projector having a second light source that emits in operation a visible beam of light in a second plane parallel to the first plane.

In addition to one or more of the features described above, or as an alternative, further embodiments of the systems may include that the measurement device further comprises a three-dimensional camera that is operably coupled to the processor.

In addition to one or more of the features described above, or as an alternative, further embodiments of the systems may include that the measurement device includes a first position indicator configured to interact with a remote device having a second position indicator.

In addition to one or more of the features described above, or as an alternative, further embodiments of the systems may include that the first position indicator includes a near field communications tag and the second position indicator includes a near field communications transmitter and a near field communications receiver.

In addition to one or more of the features described above, or as an alternative, further embodiments of the systems may include that the first position indicator includes a magnetically activated switch and the second position indicator includes a magnet.

In addition to one or more of the features described above, or as an alternative, further embodiments of the systems may include that the first position indicator includes a first feature on a body of the 2D scanner and the second position indicator includes a second feature on a housing of the remote device.

In addition to one or more of the features described above, or as an alternative, further embodiments of the systems may include that the remote device is a 3D scanner.

In addition to one or more of the features described above, or as an alternative, further embodiments of the systems may include that the first position indicator includes a camera operably coupled to the processor and the second position indicator includes a machine readable indicia on the remote device.

In addition to one or more of the features described above, or as an alternative, further embodiments of the systems may include that the machine readable indicia is one of a QR-code label and a bar-code.

According to some embodiments, methods for generating two-dimensional (2D) images of environments are provided. The methods include moving a measurement device to a plurality of registration positions in the environment, the measurement device having a 2D scanner and is sized and weighted to be carried by a single operator, the 2D scanner being configured to sweep a beam of light in a horizontal plane, wherein the plurality of registration positions includes a first registration position and a second registration position, obtaining a first plurality of 2D scan sets using the 2D scanner while the measurement device moves from the first registration position to the second registration position, each of the first plurality of 2D scan sets being a set of 2D coordinates of points in the environment, each of the first plurality of 2D scan sets being collected by the 2D scanner at a different position relative to the first registration position, determining a first translation value corresponding to a first translation direction, a second translation value corresponding to a second translation direction, a first rotation value corresponding to a first orientational axis, and a second rotation value corresponding to a second orientational axis, wherein the first translation value, the second translation value, the first rotation value, and the second rotation value are determined based at least in part on a determination of a change in movement or orientation of the measurement device, and generating a 2D image of the environment based at least in part on the plurality of 2D scans, the first translation value, the first translation direction, the second translation value, the second translation direction, the first rotation value, and the second rotation value, wherein generating the 2D image includes generating a grid map that includes a plurality of cells, each of the plurality of cells indicating a probability of a cell area being occupied.

In addition to one or more of the features described above, or as an alternative, further embodiments of the methods may include actuating a haptic feedback device in the measurement device in response to the second rotation value crossing a predetermined threshold.

In addition to one or more of the features described above, or as an alternative, further embodiments of the methods may include emitting a visible laser light beam from a laser projector onto a point on an object, the laser projector being coupled to the measurement device, measuring a distance from the measurement device to the point on the object using a three-dimensional camera coupled to the measurement device, and annotating the 2D image to include a position of the point on the object based at least in part on the distance.

In addition to one or more of the features described above, or as an alternative, further embodiments of the methods may include scanning an area about the point on the object with the three-dimensional camera, determining a scanning position and orientation of the measurement device when the area is being scanned, generating a three-dimensional point cloud of the area, and annotating the 2D image to include a linkage to the three-dimensional point cloud of the area, the annotation being positioned in the 2D image in a position corresponding to the position of the object in the area.

In addition to one or more of the features described above, or as an alternative, further embodiments of the methods may include steering a beam of light to illuminate object points in the environment, receiving light reflected from the object points, and determining a distance value to at least one of the object points.

In addition to one or more of the features described above, or as an alternative, further embodiments of the methods may include determining a position of the measurement device within the environment using a first position indicator of the measurement device that interacts with a second position indicator of a remote device.

These and other advantages and features will become more apparent from the following description taken in conjunction with the drawings.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

FIGS. 11-14 are plan views of stages of a two-dimensional map generated with the method of FIG. 10 in accordance with an embodiment;

Figure 1:
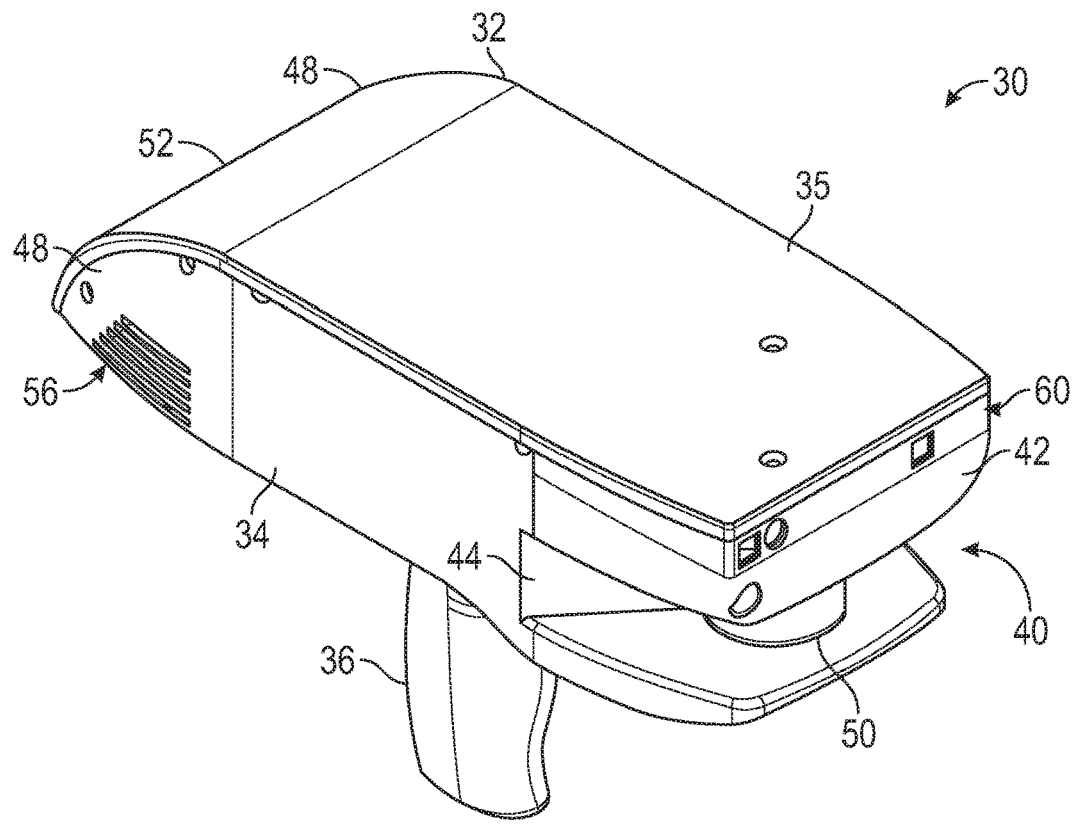
FIGS. 1-3 are perspective views of a scanning and mapping system in accordance with an embodiment.
Figure 2:
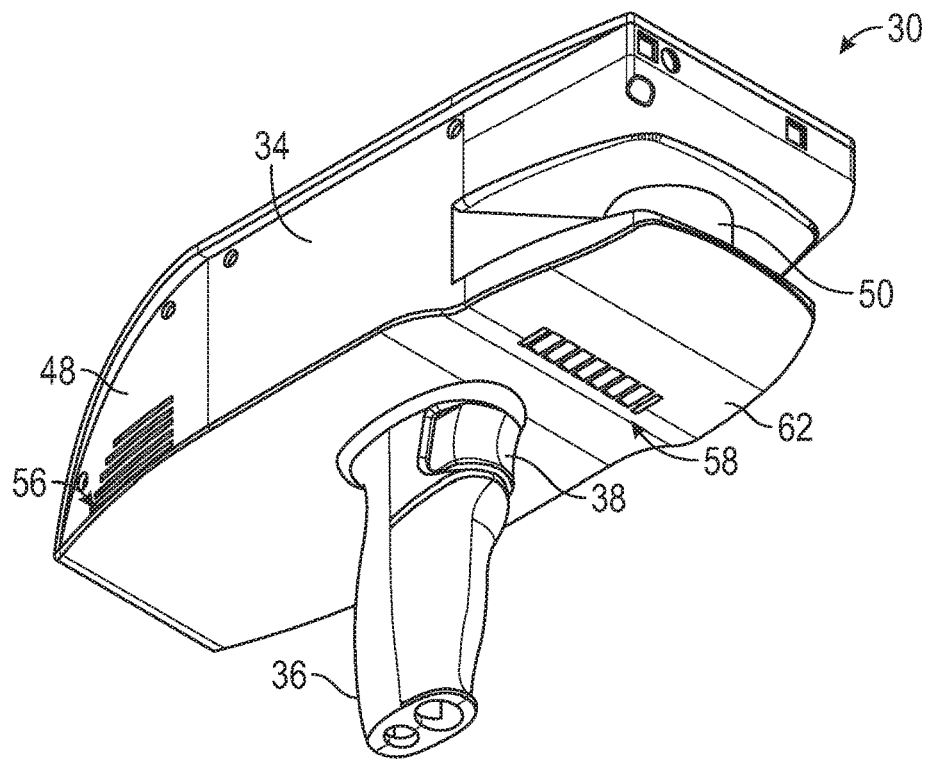
Figure 3:
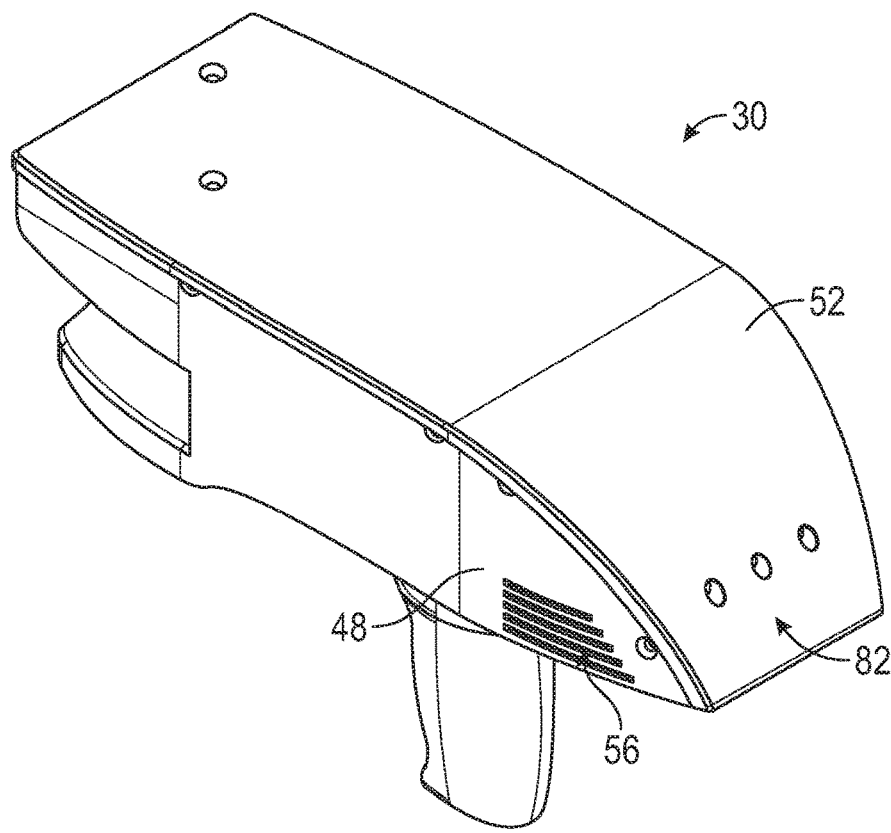
Figure 4:
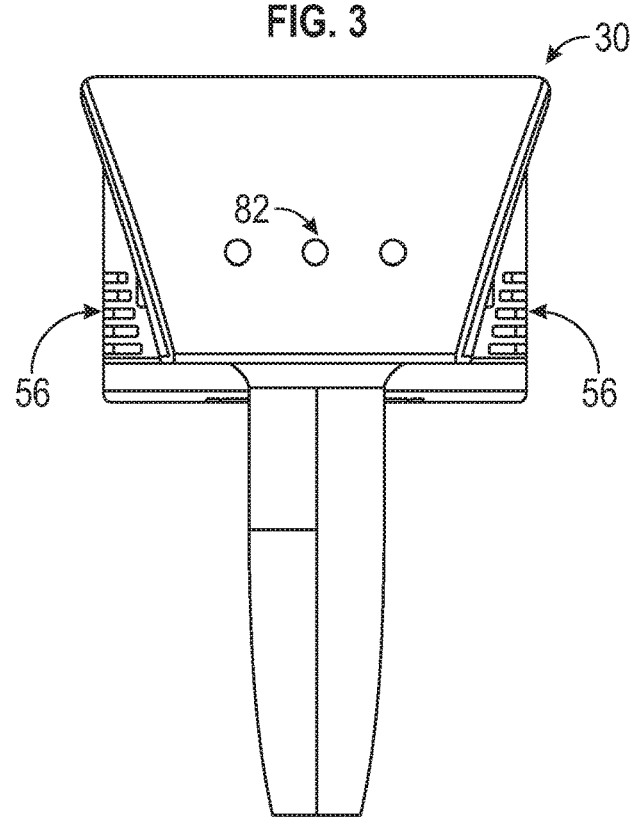
FIG. 4 is a first end view of the system of FIG. 1.
Figure 5:
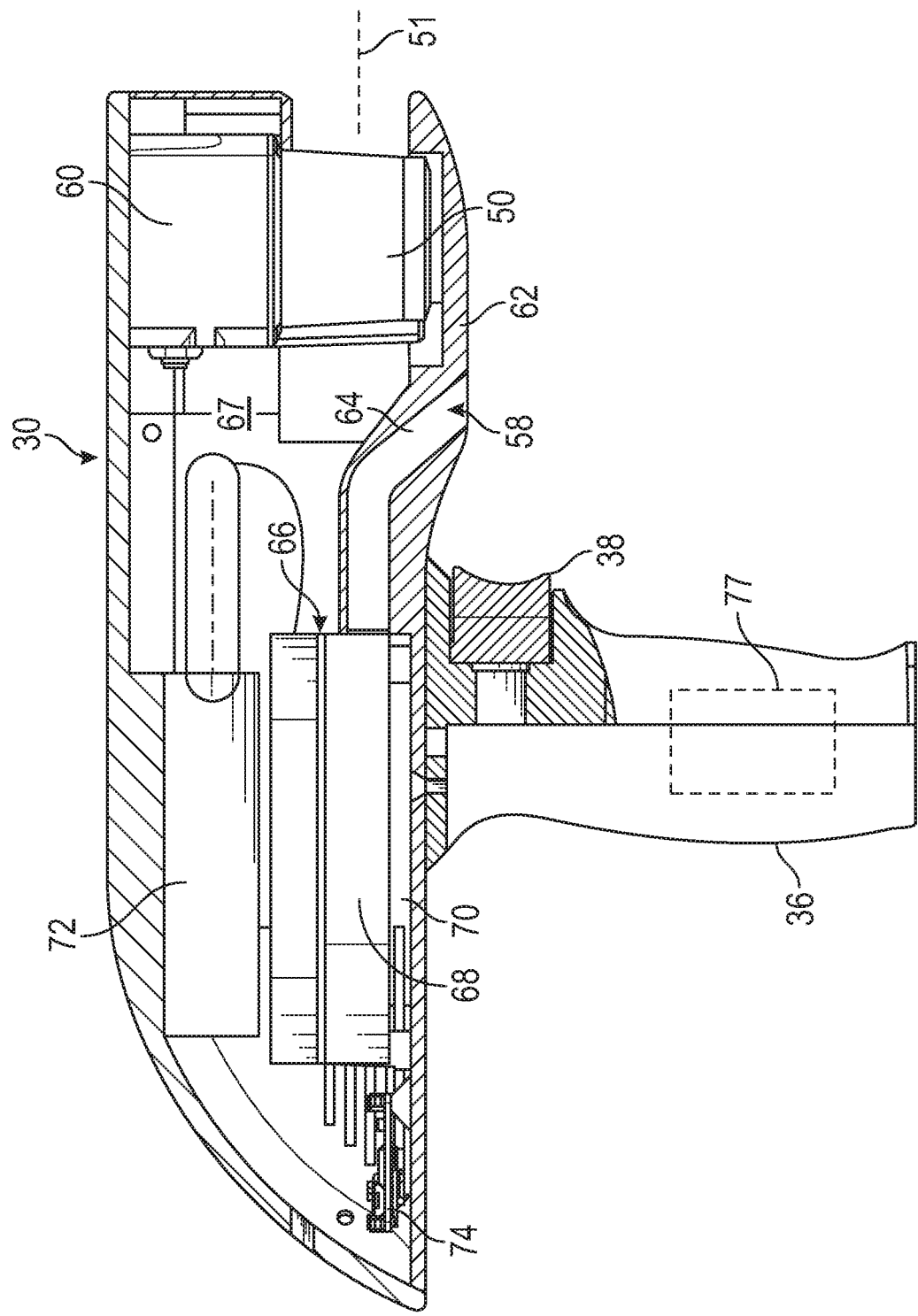
FIG. 5 is a side sectional view of the system of FIG. 1.
Figure 6:
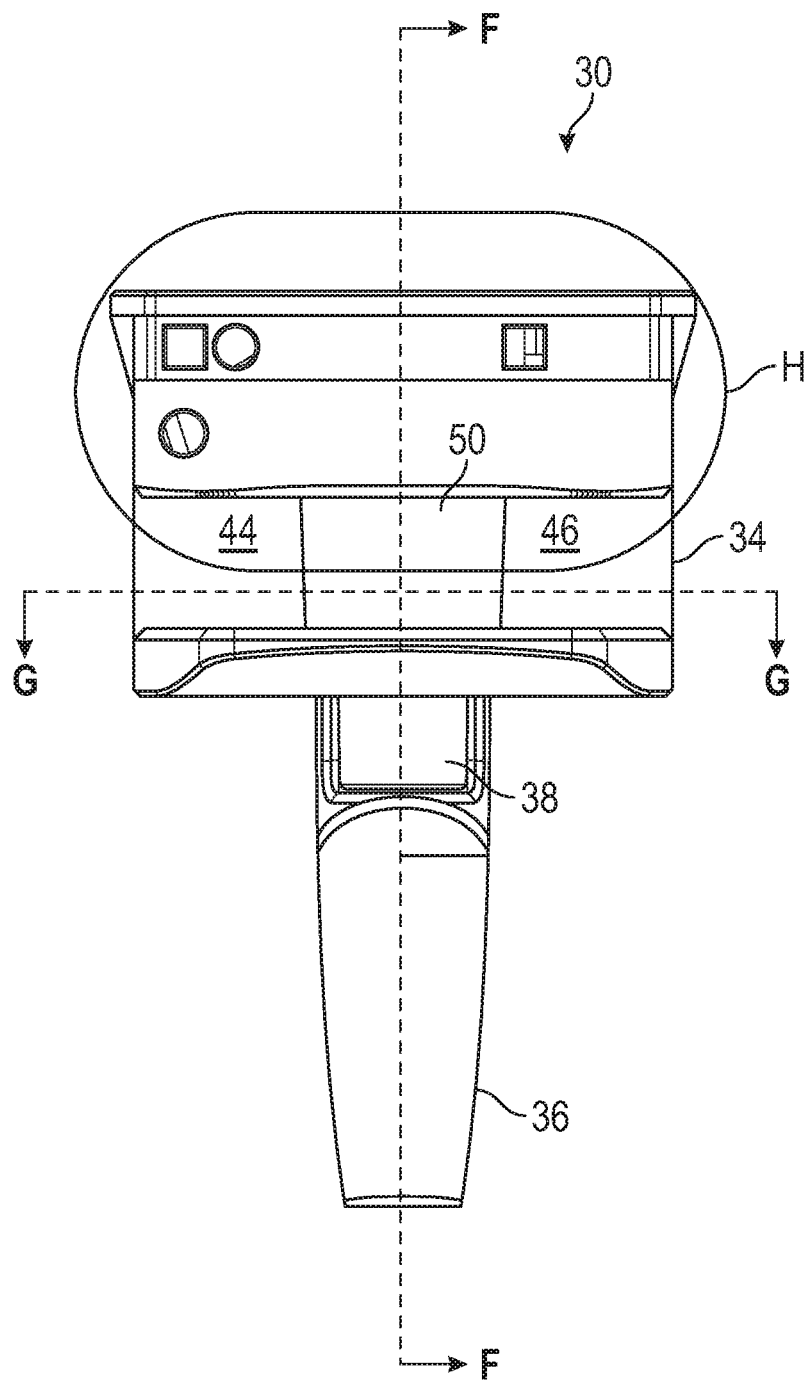
FIG. 6 is a second end view of the system of FIG. 1.
Figure 7:
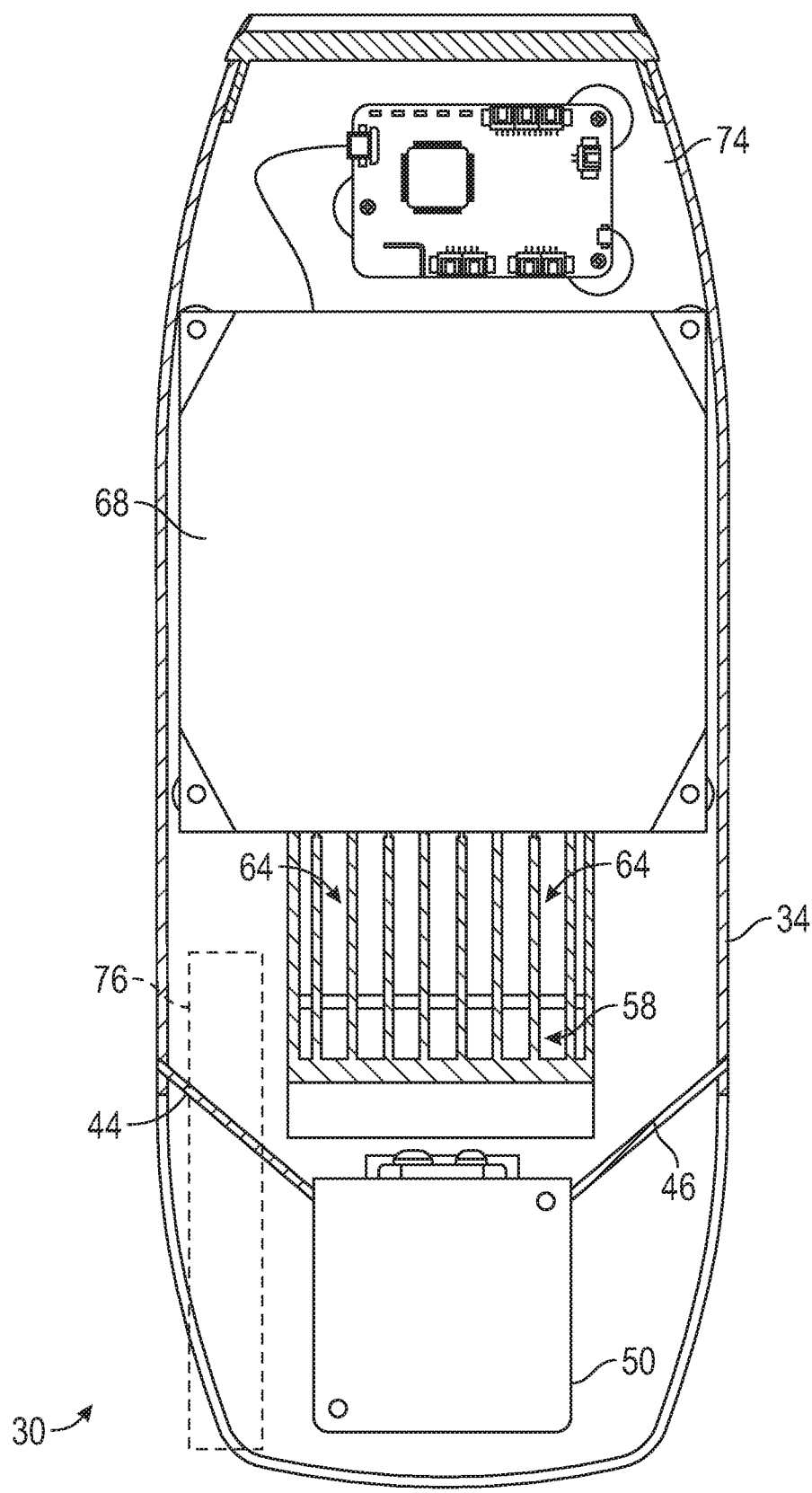
FIG. 7 is a top sectional view of the system of FIG. 1

The detailed description explains embodiments of the invention, together with advantages and features, by way of example with reference to the drawings.

DETAILED DESCRIPTION

The present invention relates to a device that includes a system having a 2D scanner that works cooperatively with an inertial measurement unit to generate an annotated two-dimensional map of an environment.

Referring now to FIGS. 1-7, an embodiment of a system 30 having a housing 32 that includes a body portion 34 and a handle portion 36. The handle 36 may include an actuator 38 that allows the operator to interact with the system 30. In the exemplary embodiment, the body 34 includes a generally rectangular center portion 35 with a slot 40 formed in an end 42. The slot 40 is at least partially defined by a pair walls 44, 46 that are angled towards a second end 48. As will be discussed in more detail herein, a portion of a two-dimensional scanner 50 is arranged between the walls 44, 46. The walls 44, 46 are angled to allow the scanner 50 to operate by emitting a light over a large angular area without interference from the walls 44, 46. As will be discussed in more detail herein, the end 42 may further include a three-dimensional camera or RGBD camera 60.

In the exemplary embodiment, the second end 48 is defined by a semi-cylindrical surface 52 and a pair of side walls 54. In an embodiment, the side walls 54 include a plurality of exhaust vent openings 56. The exhaust vent openings 56 are fluidly coupled to intake vent openings 58 arranged on a bottom surface 62 of center portion 35. The intake vent openings 58 allow external air to enter a conduit 64 having an opposite opening 66 (FIG. 5) in fluid communication with the hollow interior 67 of the body 34. In an embodiment, the opening 66 is arranged adjacent to a controller 68 which has one or more processors that is operable to perform the methods described herein. In an embodiment, the external air flows from the opening 66 over or around the controller 68 and out the exhaust vent openings 56.

The controller 68 is coupled to a wall 70 of body 34. In an embodiment, the wall 70 is coupled to or integral with the handle 36. The controller 68 is electrically coupled to the 2D scanner 50, the 3D camera 60, a power source 72, an inertial measurement unit (IMU) 74, a laser line projector 76, and a haptic feedback device 77.

Figure 9:
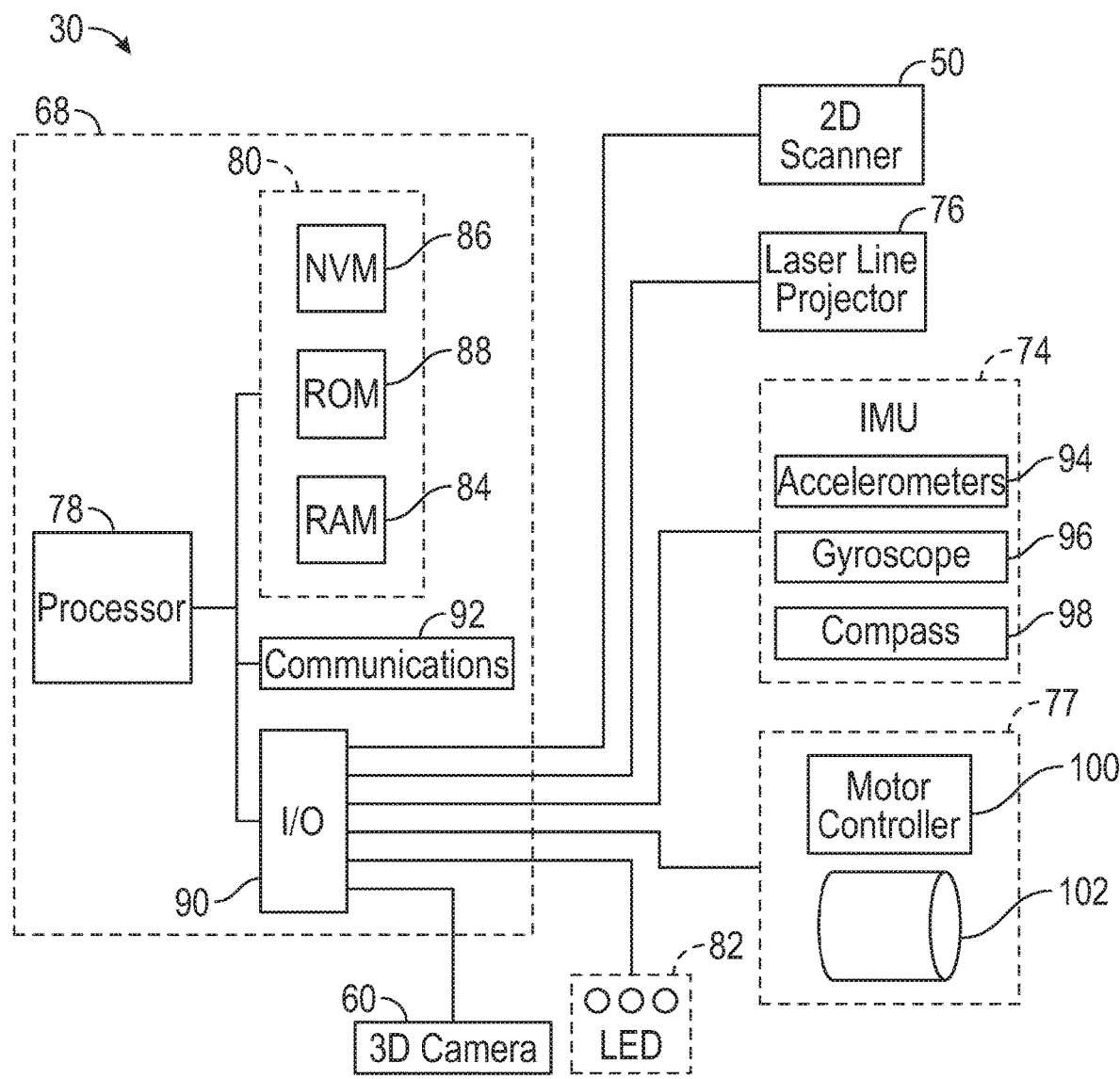
FIG. 9 is a schematic illustration of the system of FIG. 1 in accordance with an embodiment.

Referring now to FIG. 9 with continuing reference to FIGS. 1-7, elements are shown of the system 30. Controller 68 is a suitable electronic device capable of accepting data and instructions, executing the instructions to process the data, and presenting the results. The controller 68 includes one or more processing elements 78. The processors may be microprocessors, field programmable gate arrays (FPGAs), digital signal processors (DSPs), and generally any device capable of performing computing functions. The one or more processors 78 have access to memory 80 for storing information.

Controller 68 is capable of converting the analog voltage or current level provided by 2D scanner 50, 3D camera 60 and IMU 74 into a digital signal to determine a distance from the system 30 to an object in the environment. Controller 68 uses the digital signals that act as input to various processes for controlling the system 30. The digital signals represent one or more system 30 data including but not limited to distance to an object, images of the environment, acceleration, pitch orientation, yaw orientation and roll orientation.

In general, controller 68 accepts data from 2D scanner 50 and IMU 74 and is given certain instructions for the purpose of generating a two-dimensional map of a scanned environment. Controller 68 provides operating signals to the 2D scanner 50, the 3D camera 60, laser line projector 76 and haptic feedback device 77. Controller 68 also accepts data from IMU 74, indicating, for example, whether the operator is operating in the system in the desired orientation. The controller 68 compares the operational parameters to predetermined variances (e.g. yaw, pitch or roll thresholds) and if the predetermined variance is exceeded, generates a signal that activates the haptic feedback device 77. The data received by the controller 68 may be displayed on a user interface coupled to controller 68. The user interface may be one or more LEDs (light-emitting diodes) 82, an LCD (liquid-crystal diode) display, a CRT (cathode ray tube) display, or the like. A keypad may also be coupled to the user interface for providing data input to controller 68. In one embodiment, the user interface is arranged or executed on a mobile computing device that is coupled for communication, such as via a wired or wireless communications medium (e.g. Ethernet, serial, USB, Bluetooth™ or WiFi) for example, to the system 30.

The controller 68 may also be coupled to external computer networks such as a local area network (LAN) and the Internet. A LAN interconnects one or more remote computers, which are configured to communicate with controller 68 using a well-known computer communications protocol such as TCP/IP (Transmission Control Protocol/Internet (^) Protocol), RS-232, ModBus, and the like. Additional systems 30 may also be connected to LAN with the controllers 68 in each of these systems 30 being configured to send and receive data to and from remote computers and other systems 30. The LAN may be connected to the Internet. This connection allows controller 68 to communicate with one or more remote computers connected to the Internet.

The processors 78 are coupled to memory 80. The memory 80 may include random access memory (RAM)

device 84, a non-volatile memory (NVM) device 86, a read-only memory (ROM) device 88. In addition, the processors 78 may be connected to one or more input/output (I/O) controllers 90 and a communications circuit 92. In an embodiment, the communications circuit 92 provides an interface that allows wireless or wired communication with one or more external devices or networks, such as the LAN discussed above.

Figure 18:
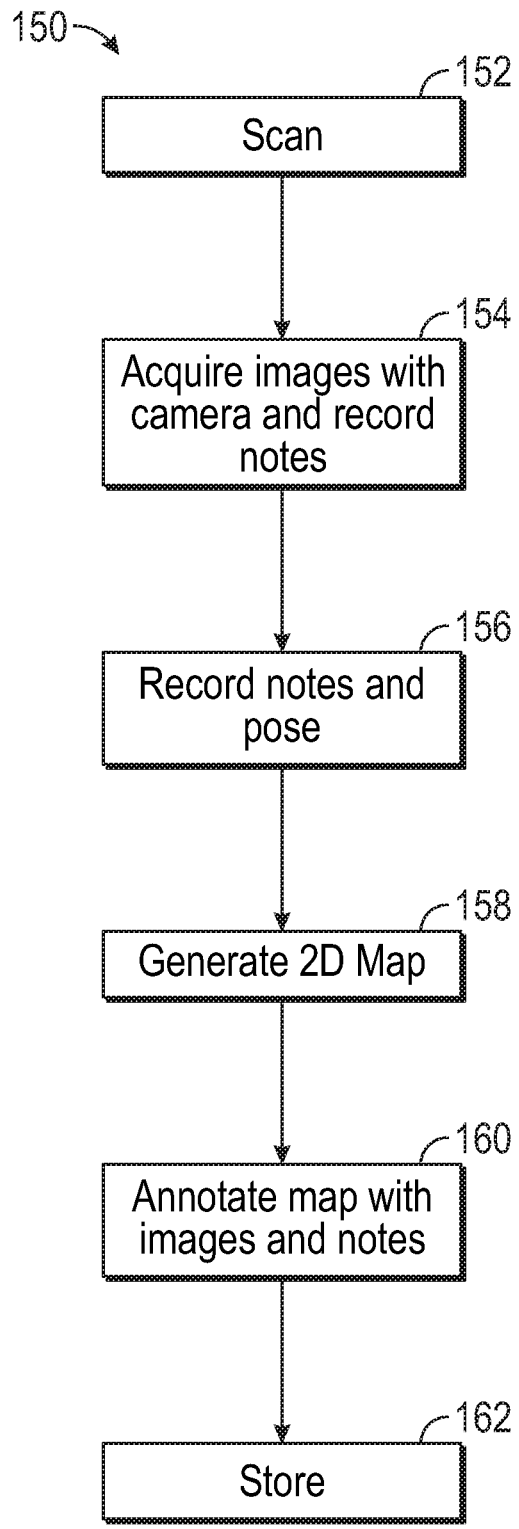
FIGS. 18-19 are views of annotated two-dimensional maps generated with the method of FIG. 17 in accordance with an embodiment.
Figure 20:
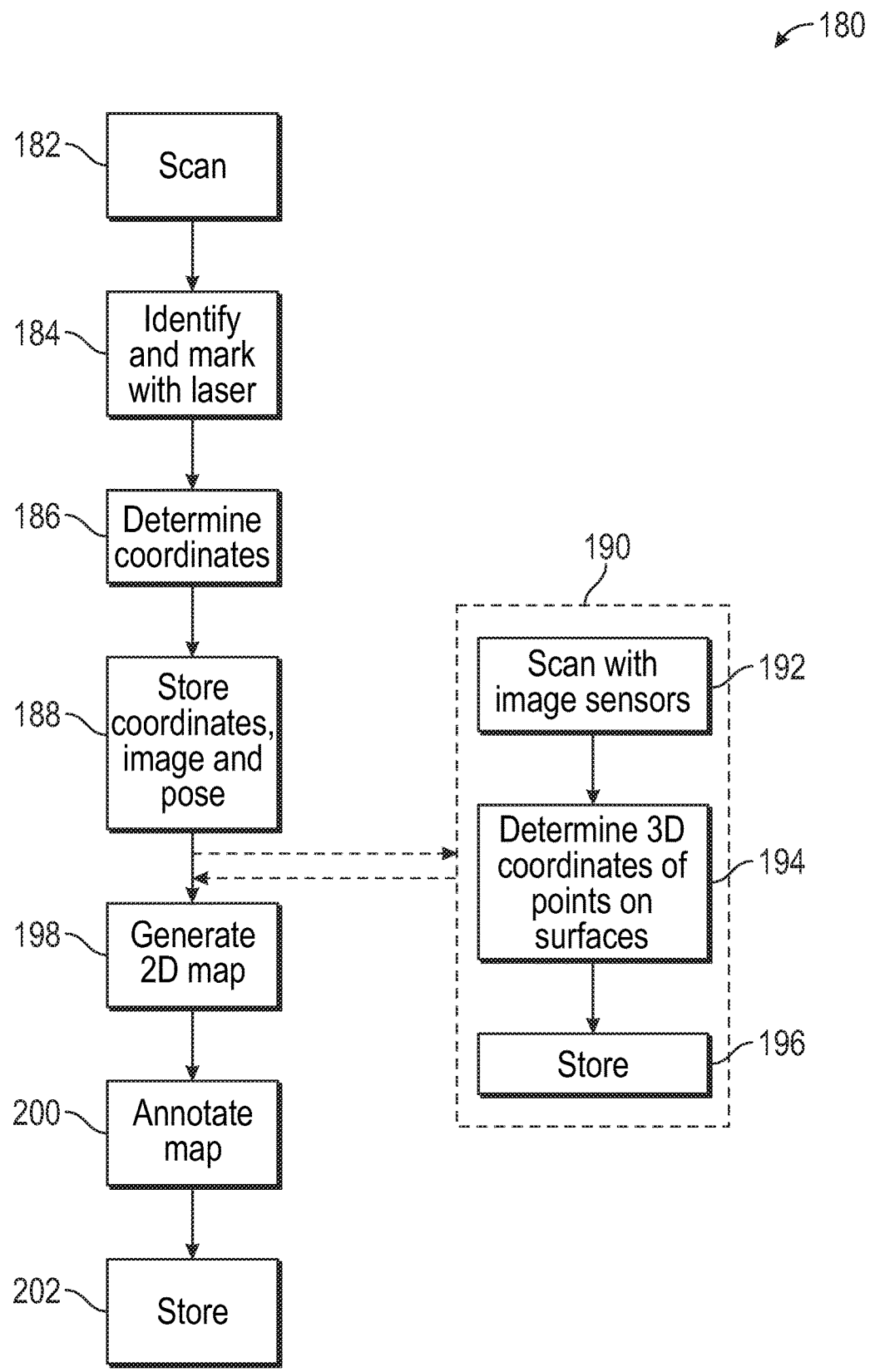
FIG. 20 is a flow diagram of a method of generating a two-dimensional map and a three-dimensional point cloud in accordance with an embodiment.

Controller 68 includes operation control methods embodied in application code shown in FIG. 13, FIG. 18, and FIG. 20. These methods are embodied in computer instructions written to be executed by processors 78, typically in the form of software. The software can be encoded in any language, including, but not limited to, assembly language, VHDL (Verilog Hardware Description Language), VHSIC HDL (Very High Speed IC Hardware Description Language), Fortran (formula translation), C, C++, C#, Objective-C, Visual C++, Java, ALGOL (algorithmic language), BASIC (beginners all-purpose symbolic instruction code), visual BASIC, ActiveX, HTML (HyperText Markup Language), Python, Ruby and any combination or derivative of at least one of the foregoing.

Coupled to the controller 68 is the 2D scanner 50. The 2D scanner 50 measures 2D coordinates in a plane. In the exemplary embodiment, the scanning is performed by steering light within a plane to illuminate object points in the environment. The 2D scanner 50 collects the reflected (scattered) light from the object points to determine 2D coordinates of the object points in the 2D plane. In an embodiment, the 2D scanner 50 scans a spot of light over an angle while at the same time measuring an angle value and corresponding distance value to each of the illuminated object points.

Examples of 2D scanners 50 include, but are not limited to, Model LMS100 scanners manufactured by Sick, Inc of Minneapolis, Minn. and scanner Models URG-04LX-UG01 and UTM-30LX manufactured by Hokuyo Automatic Co., Ltd of Osaka, Japan. The scanners in the Sick LMS100 family measure angles over a 270 degree range and over distances up to 20 meters. The Hoyuko model URG-04LX-UG01 is a low-cost 2D scanner that measures angles over a 240 degree range and distances up to 4 meters. The Hoyuko model UTM-30LX is a 2D scanner that measures angles over a 270 degree range and to distances up to 30 meters. It should be appreciated that the above 2D scanners are exemplary and other types of 2D scanners are also available.

In an embodiment, the 2D scanner 50 is oriented so as to scan a beam of light over a range of angles in a generally horizontal plane (relative to the floor of the environment being scanned). At instants in time the 2D scanner 50 returns an angle reading and a corresponding distance reading to provide 2D coordinates of object points in the horizontal plane. In completing one scan over the full range of angles, the 2D scanner returns a collection of paired angle and distance readings. As the system 30 is moved from place to place, the 2D scanner 50 continues to return 2D coordinate values. These 2D coordinate values are used to locate the position of the system 30 thereby enabling the generation of a two-dimensional map or floorplan of the environment.

Also coupled to the controller 68 is the IMU 74. The IMU 74 is a position/orientation sensor that may include accelerometers 94 (inclinometers), gyroscopes 96, a magnetometers or compass 98, and altimeters. In the exemplary embodiment, the IMU 74 includes multiple accelerometers 94 and gyroscopes 96. The compass 98 indicates a heading based on changes in magnetic field direction relative to the earth's magnetic north. The IMU 74 may further have an altimeter that indicates altitude (height). An example of a widely used altimeter is a pressure sensor. By combining readings from a combination of position/orientation sensors with a fusion algorithm that may include a Kalman filter, relatively accurate position and orientation measurements can be obtained using relatively low-cost sensor devices. In the exemplary embodiment, the IMU 74 determines the pose or orientation of the system 30 about three-axis to allow a determination of a yaw, roll and pitch parameter.

Figure 8:
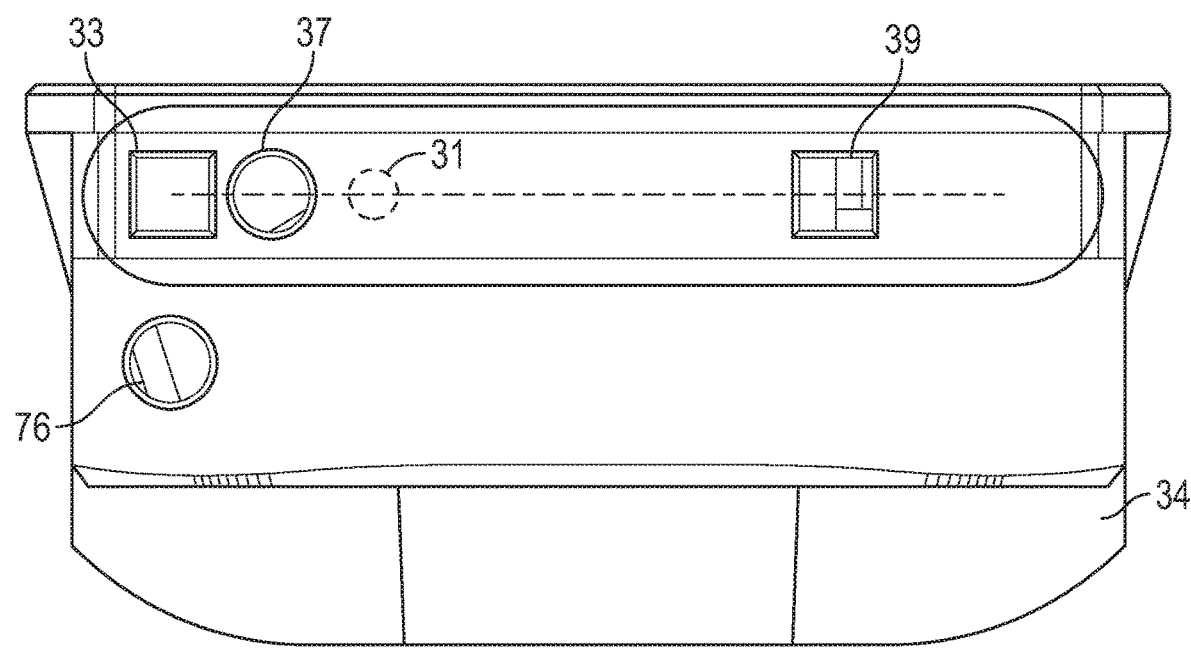
FIG. 8 is an enlarged view of a portion of the second end of FIG. 6.

In embodiment, the system 30 further includes a 3D camera 60. As used herein, the term 3D camera refers to a device that produces a two-dimensional image that includes distances to a point in the environment from the location of system 30. The 3D camera 30 may be a range camera or a stereo camera. In an embodiment, the 3D camera 30 includes an RGB-D sensor that combines color information with a per-pixel depth information. In an embodiment, the 3D camera 30 may include an infrared laser projector 31 (FIG. 8), a left infrared camera 33, a right infrared camera 39, and a color camera 37. In an embodiment, the 3D camera 60 is a RealSense™ camera model R200 manufactured by Intel Corporation.

In the exemplary embodiment, the system 30 is a handheld portable device that is sized and weighted to be carried by a single person during operation. Therefore, the plane 51 (FIG. 5) in which the 2D scanner 50 projects a light beam may not be horizontal relative to the floor or may continuously change as the computer moves during the scanning process. Thus, the signals generated by the accelerometers 94, gyroscopes 96 and compass 98 may be used to determine the pose (yaw, roll, tilt) of the system 30 and determine the orientation of the plane 51.

In an embodiment, it may be desired to maintain the pose of the system 30 (and thus the plane 51) within predetermined thresholds relative to the yaw, roll and pitch orientations of the system 30. In an embodiment, a haptic feedback device 77 is disposed within the housing 32, such as in the handle 36. The haptic feedback device 77 is a device that creates a force, vibration or motion that is felt or heard by the operator. The haptic feedback device 77 may be, but is not limited to, an eccentric rotating mass vibration motor or a linear resonant actuator for example. The haptic feedback device is used to alert the operator that the orientation of the light beam from 2D scanner 50 is equal to or beyond a predetermined threshold. In operation, when the IMU 74 measures an angle (yaw, roll, pitch or a combination thereof), the controller 68 transmits a signal to a motor controller 100 that activates a vibration motor 102. Since the vibration originates in the handle 36, the operator will be notified of the deviation in the orientation of the system 30. The vibration continues until the system 30 is oriented within the predetermined threshold or the operator releases the actuator 38. In an embodiment, it is desired for the plane 51 to be within 10-15 degrees of horizontal (relative to the ground) about the yaw, roll and pitch axes.

Figure 10:
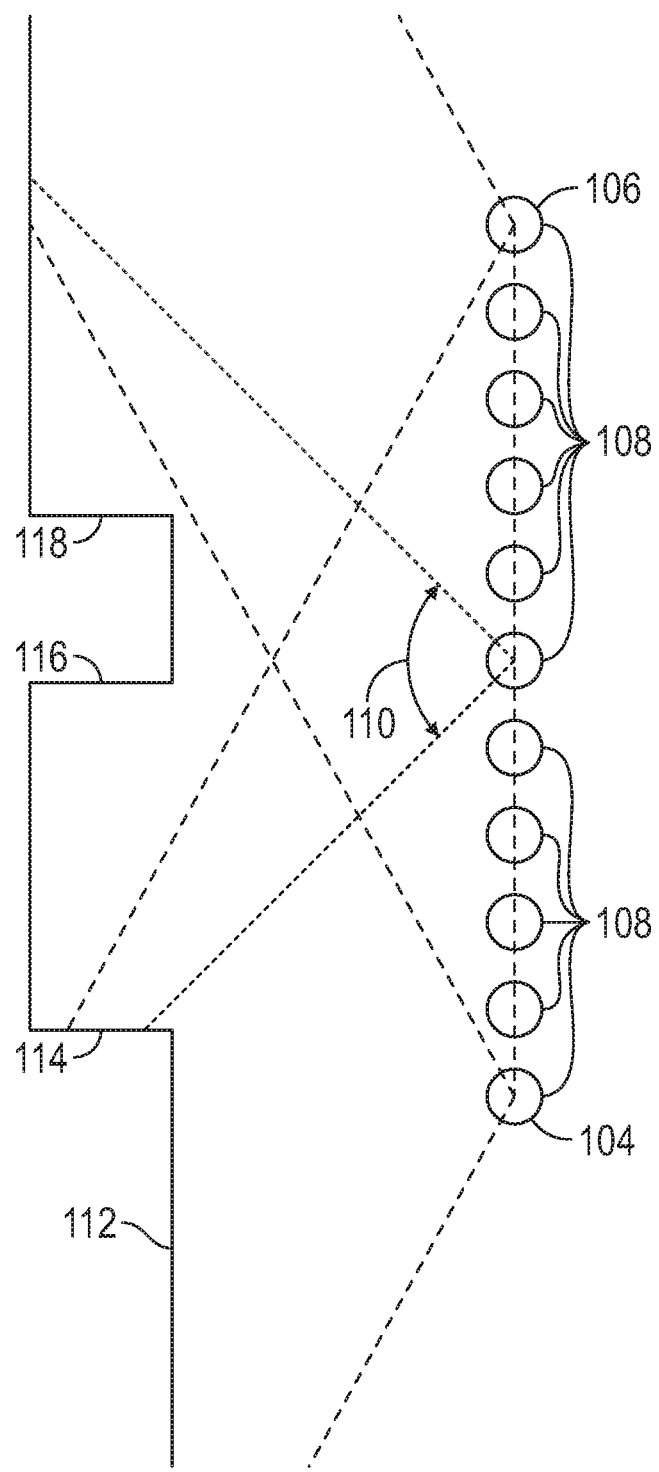
FIG. 10 is a flow diagram of a method of generating a two-dimensional map of an environment.

In an embodiment, the 2D scanner 50 makes measurements as the system 30 is moved about an environment, such from a first position 104 to a second registration position 106 as shown in FIG. 10. In an embodiment, 2D scan data is collected and processed as the system 30 passes through a plurality of 2D measuring positions 108. At each measuring position 108, the 2D scanner 50 collects 2D coordinate data over an effective FOV 110. Using methods described in more detail below, the controller 68 uses 2D scan data from the plurality of 2D scans at positions 108 to determine a position and orientation of the system 30 as it is moved about the environment. In an embodiment, the common coordinate system is represented by 2D Cartesian coordinates x, y and by an angle of rotation θ relative to the x or y axis. In an embodiment, the x and y axes lie in the plane of the 2D scanner and may be further based on a direction of a "front" of the 2D scanner 50.

Figure 11:
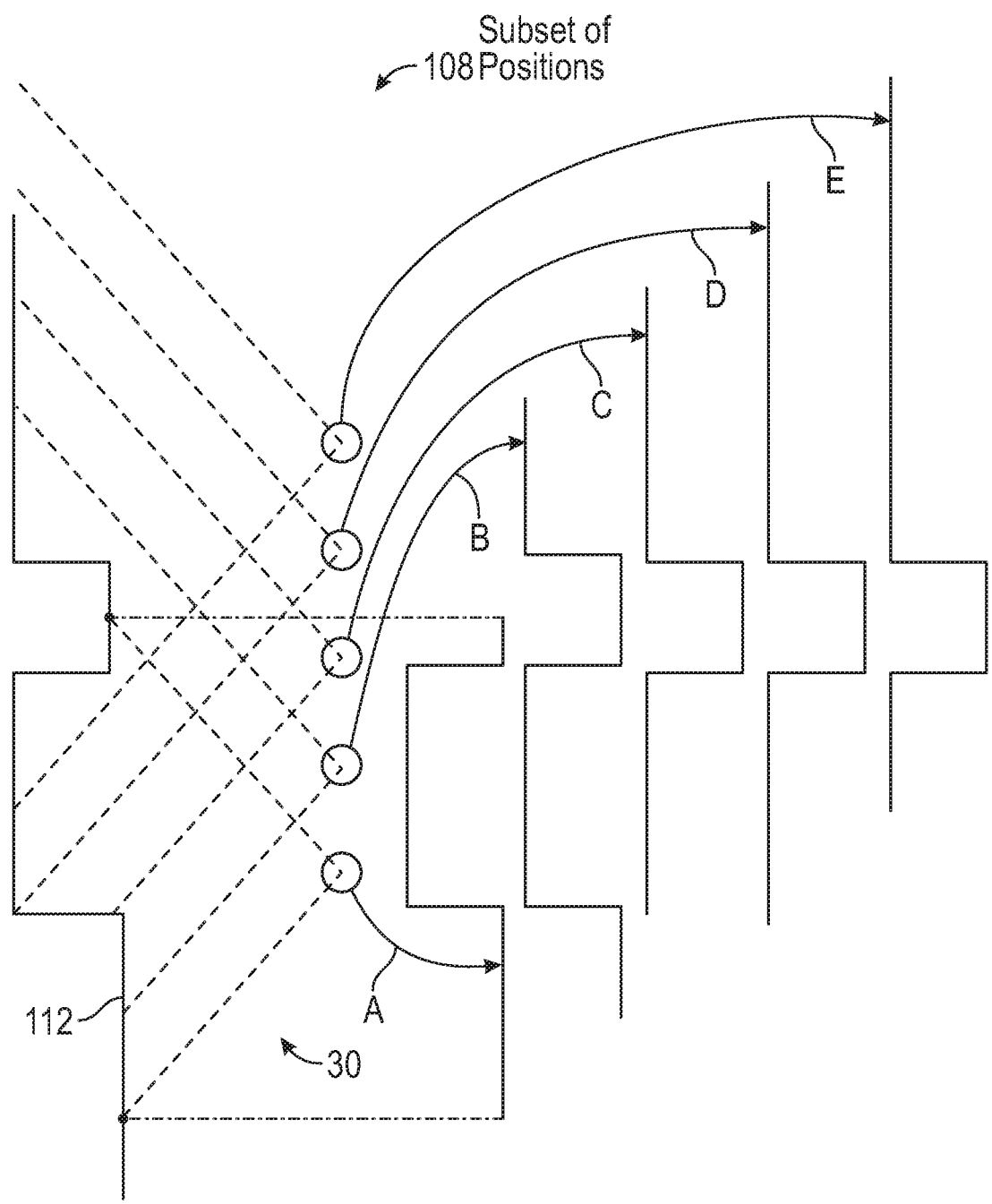

FIG. 11 shows the 2D system 30 collecting 2D scan data at selected positions 108 over an effective FOV 110. At different positions 108, the 2D scanner 50 captures a portion of the object 112 marked A, B, C, D, and E. FIG. 11 shows 2D scanner 50 moving in time relative to a fixed frame of reference of the object 112.

FIG. 12 includes the same information as FIG. 11 but shows it from the frame of reference of the system 30 rather than the frame of reference of the object 112. FIG. 12 illustrates that in the system 30 frame of reference, the position of features on the object change over time. Therefore, the distance traveled by the system 30 can be determined from the 2D scan data sent from the 2D scanner 50 to the controller 68.

As the 2D scanner 50 takes successive 2D readings and performs best-fit calculations, the controller 68 keeps track of the translation and rotation of the 2D scanner 50, which is the same as the translation and rotation of the system 30. In this way, the controller 68 is able to accurately determine the change in the values of x, y, 9 as the system 30 moves from the first position 104 to the second position 106.

In an embodiment, the controller 68 is configured to determine a first translation value, a second translation value, along with first and second rotation values (yaw, roll, pitch) that, when applied to a combination of the first 2D scan data and second 2D scan data, results in transformed first 2D data that closely matches transformed second 2D data according to an objective mathematical criterion. In general, the translation and rotation may be applied to the first scan data, the second scan data, or to a combination of the two. For example, a translation applied to the first data set is equivalent to a negative of the translation applied to the second data set in the sense that both actions produce the same match in the transformed data sets. An example of an "objective mathematical criterion" is that of minimizing the sum of squared residual errors for those portions of the scan data determined to overlap. Another type of objective mathematical criterion may involve a matching of multiple features identified on the object. For example, such features might be the edge transitions 114, 116, and 118 shown in FIG. 10. The mathematical criterion may involve processing of the raw data provided by the 2D scanner 50 to the controller 68, or it may involve a first intermediate level of processing in which features are represented as a collection of line segments using methods that are known in the art, for example, methods based on the Iterative Closest Point (ICP). Such a method based on ICP is described in Censi, A., "An ICP variant using a point-to-line metric," IEEE International Conference on Robotics and Automation (ICRA) 2008, which is incorporated by reference herein.

In an embodiment, assuming that the plane 51 of the light beam from 2D scanner 50 remains horizontal relative to the ground plane, the first translation value is dx, the second translation value is dy, and the first rotation value dθ. If the first scan data is collected with the 2D scanner 50 having translational and rotational coordinates (in a reference coordinate system) of $(x_1, y_1, \theta_1)$, then when the second 2D scan data is collected at a second location the coordinates are given by $(x_2, y_2, \theta_2) = (x_1+dx, y_1+dy, \theta_1+d\theta)$. In an embodiment, the controller 68 is further configured to determine a third translation value (for example, dz) and a second and third rotation values (for example, pitch and roll). The third translation value, second rotation value, and third rotation value may be determined based at least in part on readings from the IMU 74.

The 2D scanner 50 collects 2D scan data starting at the first position 104 and more 2D scan data at the second position 106. In some cases, these scans may suffice to determine the position and orientation of the system 30 at the second position 106 relative to the first position 104. In other cases, the two sets of 2D scan data are not sufficient to enable the controller 68 to accurately determine the first translation value, the second translation value, and the first rotation value. This problem may be avoided by collecting 2D scan data at intermediate scan positions 108. In an embodiment, the 2D scan data is collected and processed at regular intervals, for example, once per second. In this way, features in the environment are identified in successive 2D scans at positions 108. In an embodiment, when more than two 2D scans are obtained, the controller 68 may use the information from all the successive 2D scans in determining the translation and rotation values in moving from the first position 104 to the second position 106. In another embodiment, only the first and last scans in the final calculation, simply using the intermediate 2D scans to ensure proper correspondence of matching features. In most cases, accuracy of matching is improved by incorporating information from multiple successive 2D scans.

It should be appreciated that as the system 30 is moved beyond the second position 106, a two-dimensional image or map of the environment being scanned may be generated.

Figure 14:
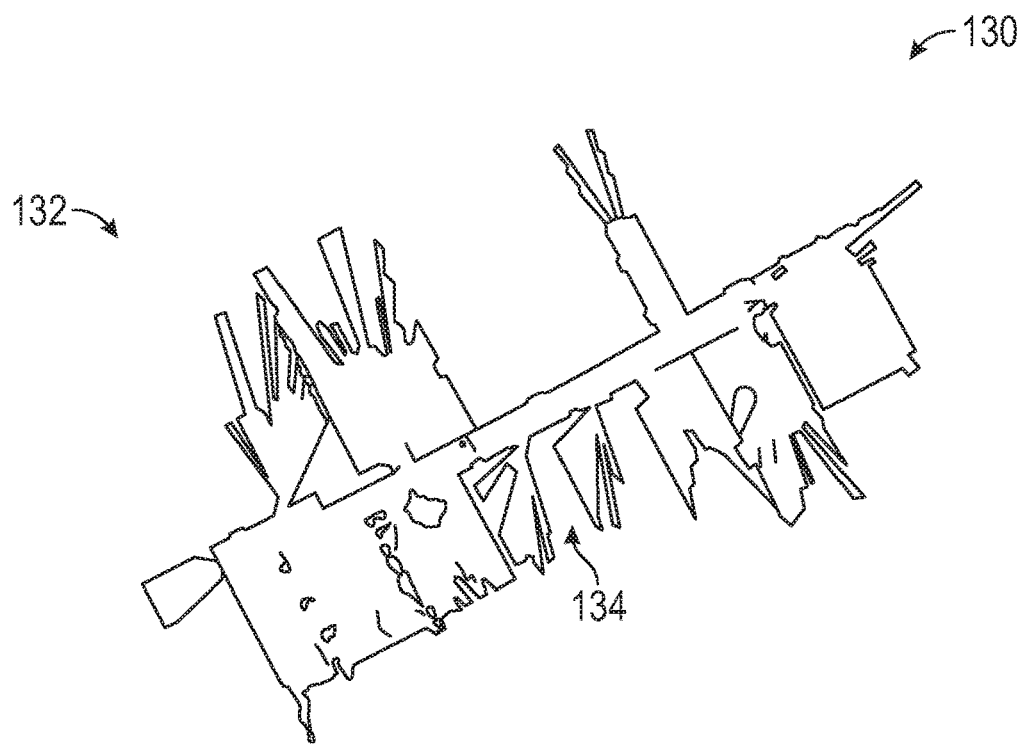

Referring now to FIG. 13, a method 120 is shown for generating a two-dimensional map with annotations. The method 120 starts in block 122 where the facility or area is scanned to acquire scan data 130, such as that shown in FIG. 14. The scanning is performed by carrying the system 30 through the area to be scanned. The system 30 measures distances from the system 30 to an object, such as a wall for example, and also a pose of the system 30 in an embodiment the user interacts with the system 30 via actuator 38. In other embodiments, a mobile computing device (e.g. cellular phone) provides a user interface that allows the operator to initiate the functions and control methods described herein. Using the registration process desired herein, the two dimensional locations of the measured points on the scanned objects (e.g. walls, doors, windows, cubicles, file cabinets etc.) may be determined. It is noted that the initial scan data may include artifacts, such as data that extends through a window 132 or an open door 134 for example. Therefore, the scan data 130 may include additional information that is not desired in a 2D map or layout of the scanned area.

Figure 15:
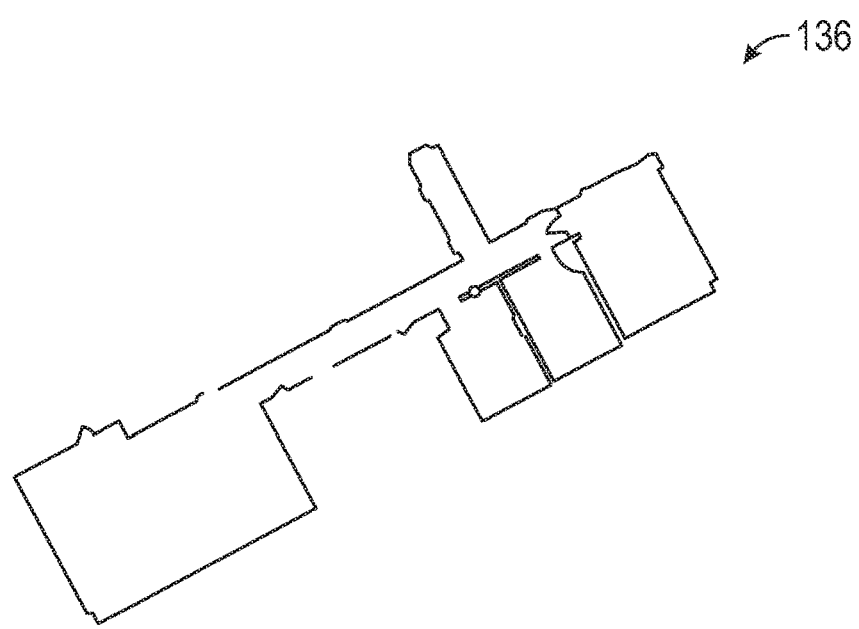
FIG. 15 is a flow diagram of a method of generating a two-dimensional map with annotations in accordance with an embodiment.
Figure 16:
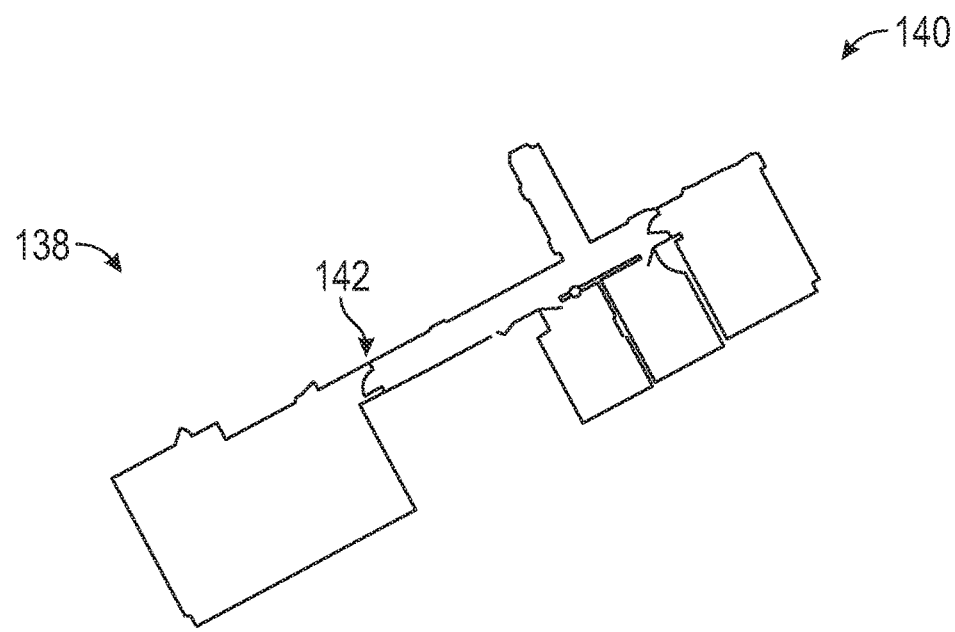
FIG. 16 is a plan view of an annotated two-dimensional map generated with the method of FIG. 15 in accordance with an embodiment.
Figure 17:
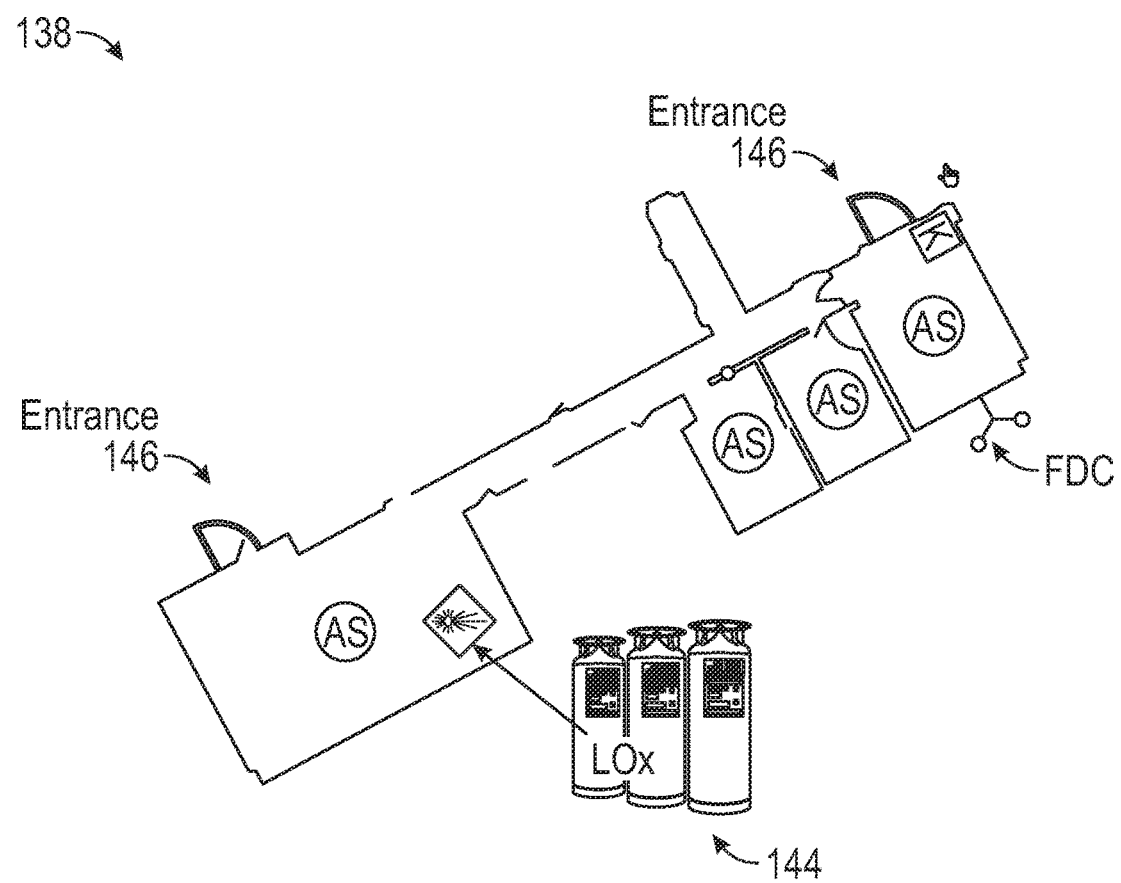
FIG. 17 is a flow diagram of a method of generating a two-dimensional map and a three-dimensional point cloud in accordance with an embodiment.

The method 120 then proceeds to block 124 where a 2D map 136 is generated of the scanned area as shown in FIG. 15. The generated 2D map 136 represents a scan of the area, such as in the form of a floor plan without the artifacts of the initial scan data. It should be appreciated that the 2D map 136 may be utilized directly by an architect, interior designer or construction contractor as it represents a dimensionally accurate representation of the scanned area. In the embodiment of FIG. 13, the method 120 then proceeds to block 126 where user-defined annotations are made to the 2D maps 136 to define an annotated 2D map 138 (FIG. 16 and FIG. 17) that includes information, such as dimensions of features 140, the location of doors 142, the relative positions of objects (e.g. liquid oxygen tanks 144, entrances/exits or egresses 146 or other notable features such as but not limited to the location of automated sprinkler systems ("AS"), knox or key boxes ("K"), or fire department connection points ("FDC") f. In some geographic regions, public safety services such as fire departments may keep records of building or facility layouts for use in case of an emergency as an aid to the public safety personnel in responding to an event. It should be appreciated that these annotations may be advantageous in alerting the public safety personnel to potential issues they may encounter when entering the facility, and also allow them to quickly locate egress locations.

Once the annotations of the 2D annotated map 138 are completed, the method 120 then proceeds to block 128 where the 2D annotated map 138 is stored in memory, such as nonvolatile memory 80 for example. The 2D annotated map 138 may also be stored in a network accessible storage device or server so that it may be accessed by the desired personnel.

Referring now to FIG. 18, another method 150 is shown for generating a 2D map or layout. In this embodiment, the method 150 starts in block 152 with the operator initiating the scanning of an area or facility with the system 30 as described herein. The method 150 then proceeds to block 154 wherein the operator acquires images with a camera during the scanning process. The images may be acquired by a camera located in a mobile computing device (e.g. personal digital assistant, cellular phone, tablet or laptop) carried by the operator for example. In an embodiment, the system 30 may include a holder (not shown) that couples the mobile computing device to the system 30. In block 154, the operator may further record notes. These notes may be audio notes or sounds recorded by a microphone in the mobile computing device. These notes may further be textual notes input using a keyboard on the mobile computing device. It should be appreciated that the acquiring of images and recording of notes may be performed simultaneously, such as when the operator acquires a video. In an embodiment, the recording of the images or notes may be performed using a software application executed on a processor of the mobile computing device. The software application may be configured to communicate with the system 30, such as by a wired or wireless (e.g. Bluetooth™) connection for example, to transmit the acquired images or recorded notes to the system 30. In one embodiment, the operator may initiate the image acquisition by actuating actuator 38 that causes the software application to transition to an image acquisition mode.

Figure 19:
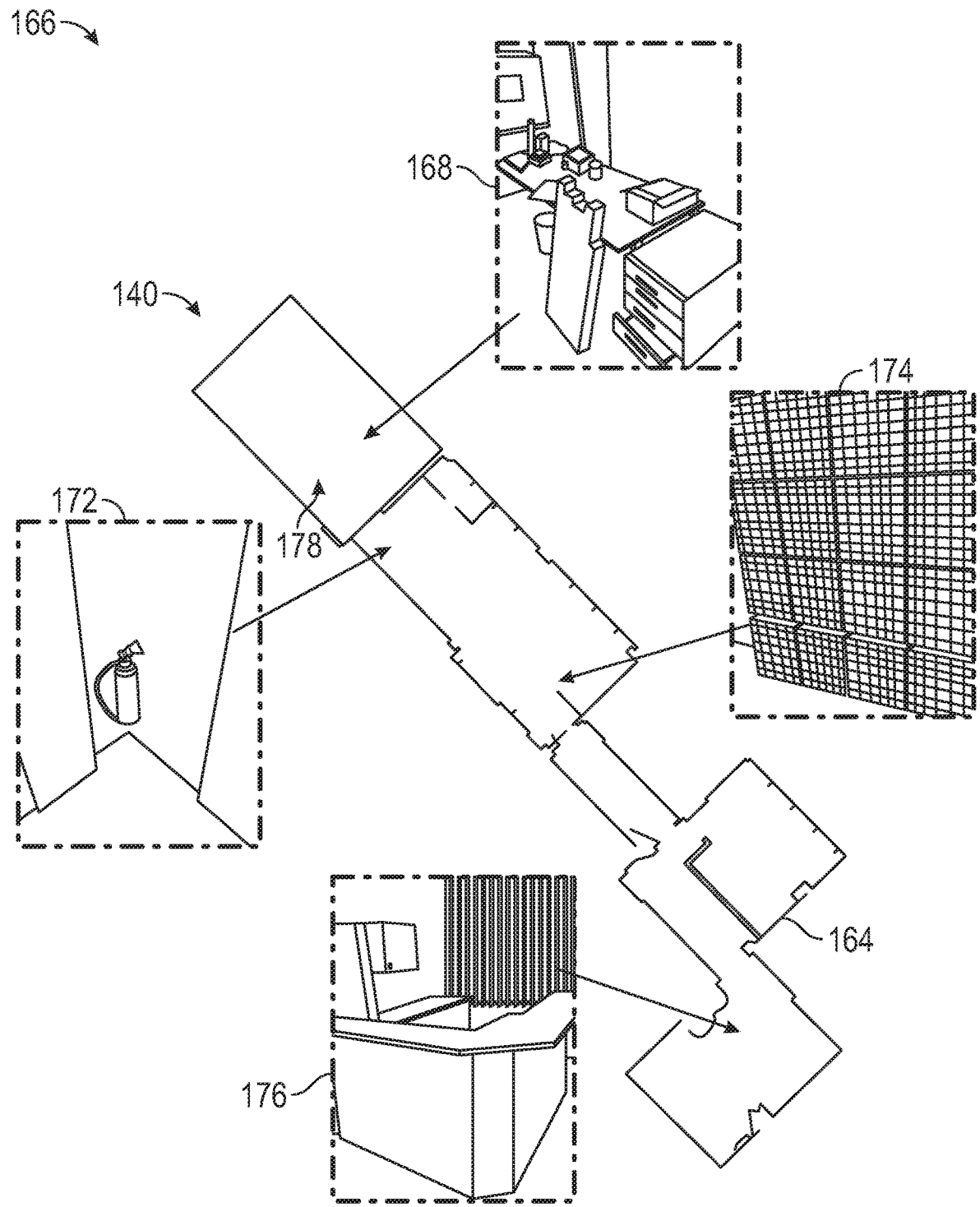

The method 150 then proceeds to block 156 where the images and notes are stored in memory, such as memory 80 for example. In an embodiment, the data on the pose of the system 30 is stored with the images and notes. In still another embodiment, the time or the location of the system 30 when the images are acquired or notes were recorded is also stored. Once the scanning of the area or facility is completed, the method 150 then proceeds to block 158 where the 2D map 164 (FIG. 19) is generated as described herein. The method then proceeds to block 160 where an annotated 2D map 166 is generated. The annotated 2D map 166 may include user-defined annotations, such as dimensions 140 or room size 178 described herein above with respect to FIG. 15. The annotations may further include user-defined free-form text or hyperlinks for example. Further, in the exemplary embodiment, the acquired images 168 and recorded notes are integrated into the annotated 2D map 166. In an embodiment, the image annotations are positioned to the side of the 2D map 164 the image was acquired or the note recorded. It should be appreciated that the images allow the operator to provide information to the map user on the location of objects, obstructions and structures, such as but not limited to fire extinguisher 172, barrier 174 and counter/desk 176 for example. Finally, the method 300 proceeds to block 162 where the annotated map is stored in memory.

It should be appreciated that the image or note annotations may be advantageous in embodiments where the annotated 2D map 166 is generated for public safety personnel, such as a fire fighter for example. The images allow the fire fighter to anticipate obstructions that may not be seen in the limited visibility conditions such as during a fire in the facility. The image or note annotations may further be advantageous in police or criminal investigations for documenting a crime scene and allow the investigator to make contemporaneous notes on what they find while performing the scan.

Figure 21:
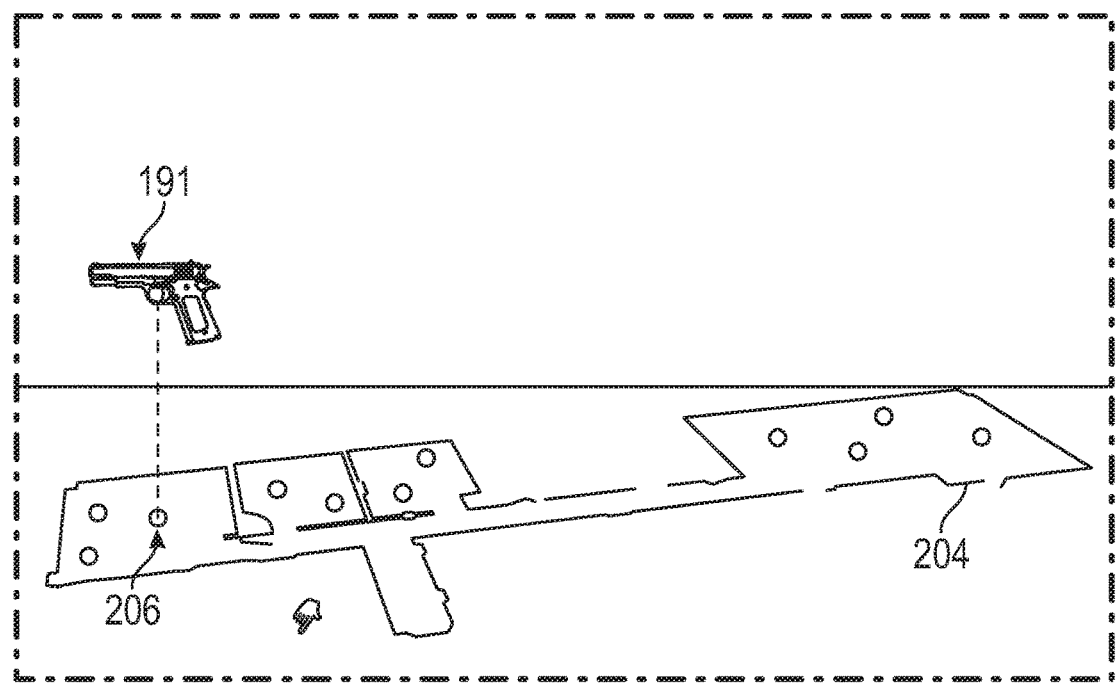
FIGS. 21-22 are views of annotated two-dimensional maps generated with the method of FIG. 20 in accordance with an embodiment.
Figure 22:
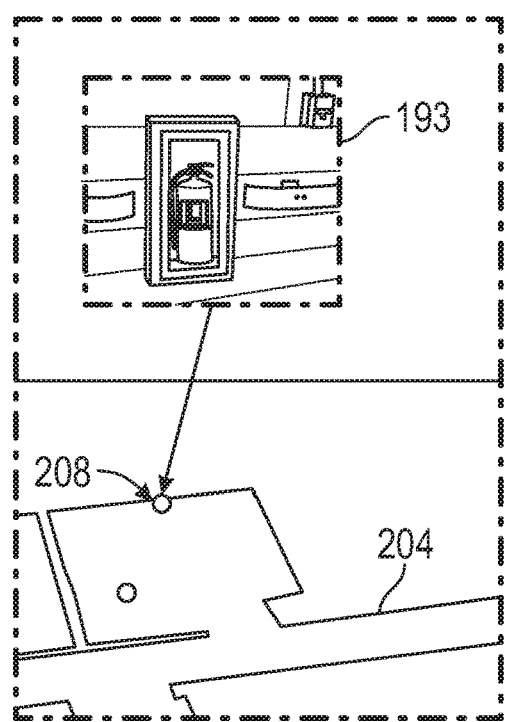

Referring now to FIG. 20, another method 180 is shown of generating a 2D map having annotation that include 3D coordinates of objects within the scanned area. The method 180 begins in block 182 with the operator scanning the area. During the scanning process, the operator may see an object, such as evidence 191 (FIG. 21) or equipment 193 (FIG. 22) for example, that the operator may desire to locate more precisely within the 2D map or acquire additional information. In an embodiment, the system 30 includes a laser projector 76 (FIG. 9) that the operator may activate. The laser projector 76 emits a visible beam of light that allows the operator to see the direction the system 76 is pointing. Once the operator locates the light beam from laser projector 76 on the desired object, the method 180 proceeds to block 186 where the coordinates of the spot on the object of interest are determined. In one embodiment, the coordinates of the object are determined by first determining a distance from system 30 to the object. In an embodiment, this distance may be determined by a 3D camera 60 (FIG. 9) for example. In addition to the distance, the 3D camera 60 also may acquire an image of the object. Based on knowing the distance along with the pose of the system 30, the coordinates of the object may be determined. The method 180 then proceeds to block 188 where the information (e.g. coordinates and image) of the object are stored in memory.

It should be appreciated that, in some embodiments, the operator may desire to obtain a three-dimensional (3D) representation of the object of interest in addition to the location relative to the 2D map. In this embodiment, the method 180 proceeds to scanning block 190 and acquires 3D coordinates of points on the object of interest. In an embodiment, the object is scanned with the 3D camera 60 in block 192. The system 30 then proceeds to determine the 3D coordinates of points on the surface of the object or interest in block 194. In an embodiment, the 3D coordinates may be determined by determining the pose of the system 30 when the image is acquired by the 3D camera. The pose information along with the distances and a registration of the images acquired by the 3D camera may allow the generation of a 3D point cloud of the object of interest. In one embodiment, the orientation of the object of interest relative to the environment is also determined from the acquired images. This orientation information may also be stored and later used to accurately represent the object of interest on the 2D map. The method 180 then proceeds to block 196 where the 3D coordinate data is stored in memory.

The method 180 then proceeds to block 198 where the 2D map 204 (FIG. 21, FIG. 22) is generated as described herein. In an embodiment, the location of the objects of interest (determined in blocks 184-186) are displayed on the 2D map 204 as a symbol 206, such as a small circle for example. It should be appreciated that the 2D map 204 may include additional user-defined annotations added in block 200, such as those described herein with reference to FIG. 13 and FIG. 18. The 2D map 204 and the annotations are then stored in block 202.

In use, the map user may select one of the symbols, such as symbol 206 or symbol 208 for example. In response, an image of the object of interest 191, 193 may be displayed. Where the object or interest 191, 193 was scanned to obtain 3D coordinates of the object, the 3D representation of the object of interest 191, 193 may be displayed.

Figure 23:
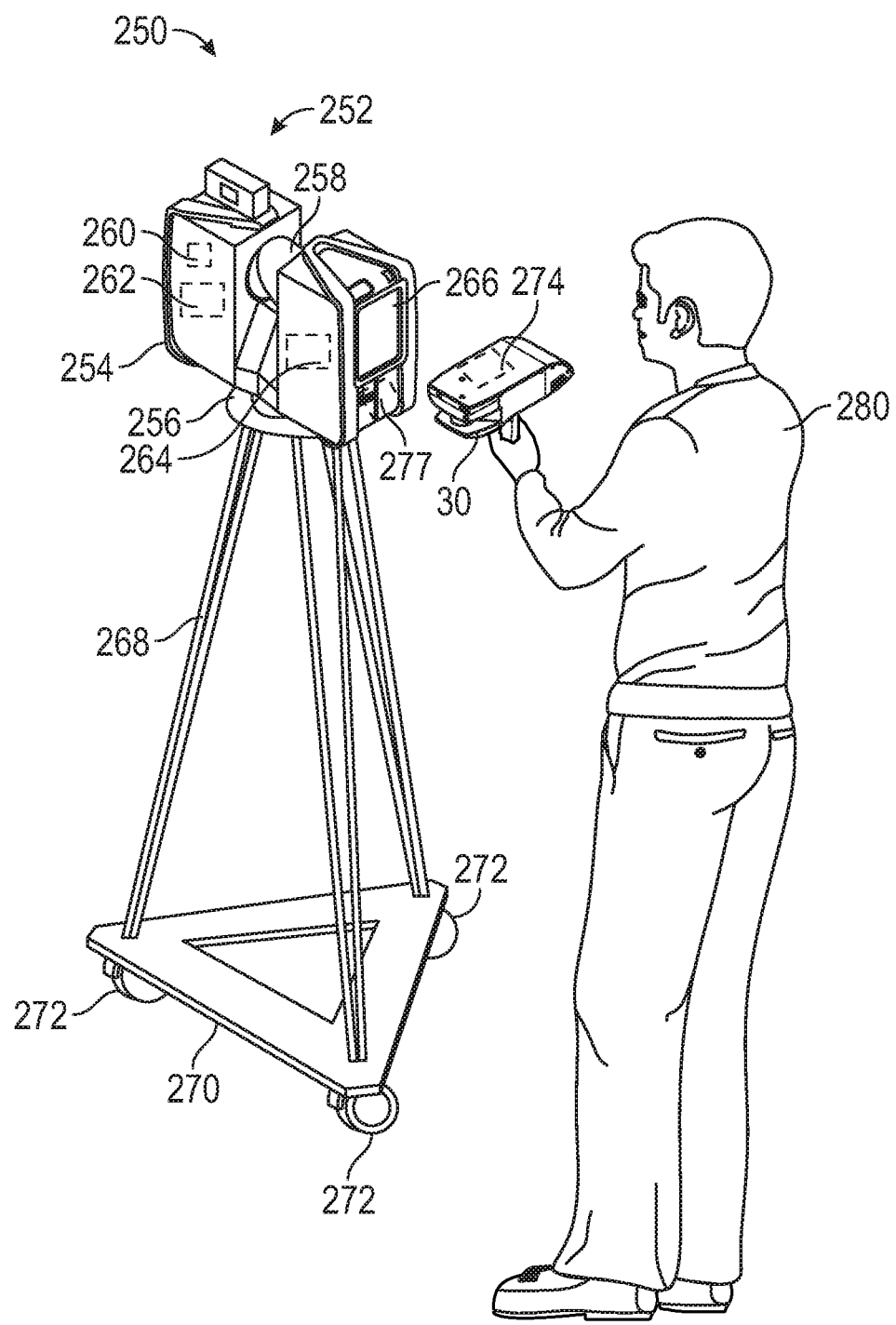
FIGS. 23-24 are views of a mobile mapping system in accordance with an embodiment.
Figure 24:
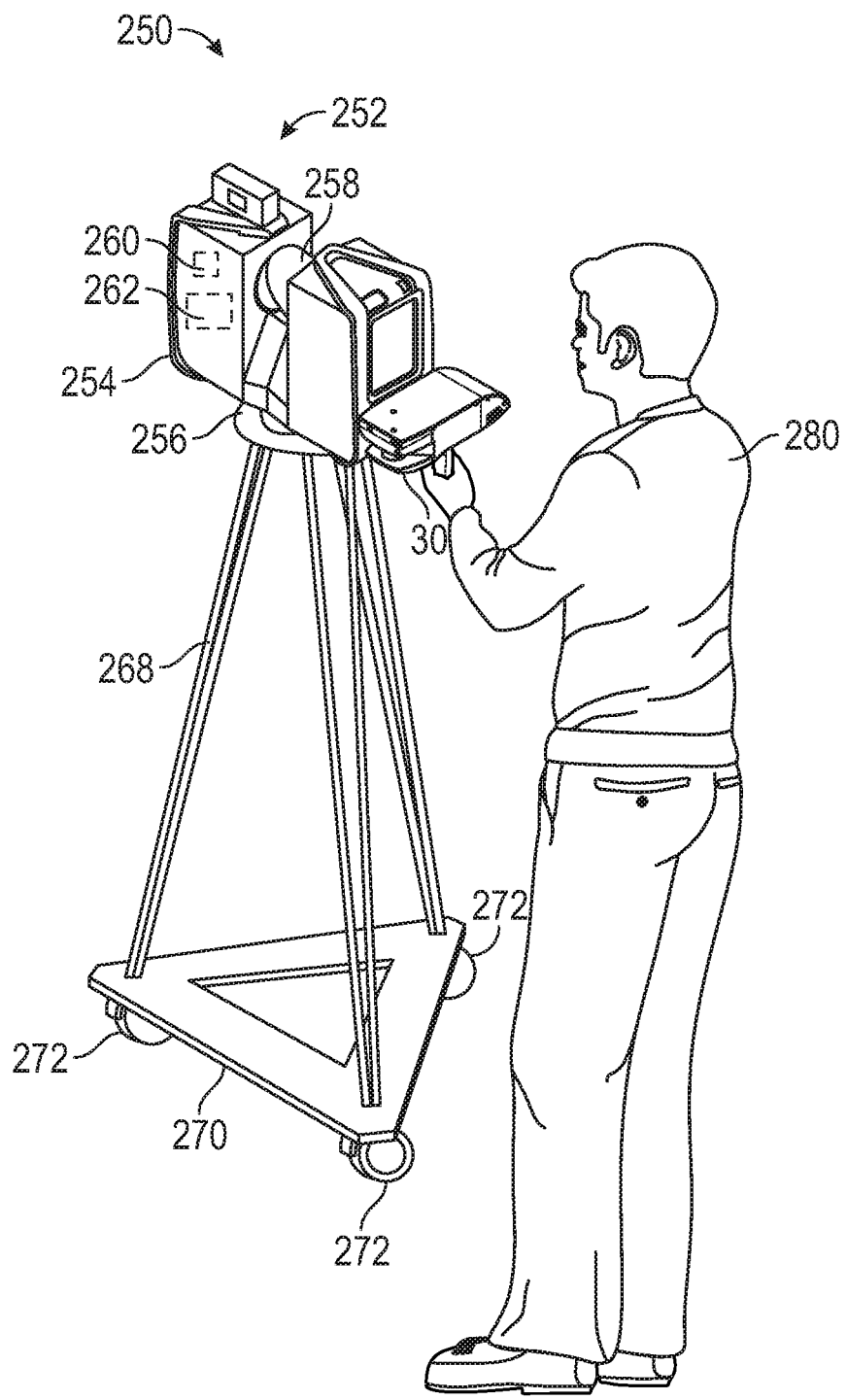

Referring now to FIG. 23 and FIG. 24, an embodiment of a mobile mapping system 250 is shown that includes a 2D scanner 30 and a 3D measurement device 252. In the exemplary embodiment, the 2D scanner 30 is the system 30 described herein with respect to FIGS. 1-7 and the 3D measurement device 252 is a laser scanner 252. The laser scanner 252 may be a time-of-flight type scanner such as the laser scanner described in commonly owned U.S. Pat. No. 8,705,016, the contents of which are incorporated by reference herein.

The laser scanner 252 has a measuring head 254 and a base 256. The measuring head 254 is mounted on the base 256 such that the laser scanner 252 may be rotated about a vertical axis (e.g. an axis extending perpendicular to the surface upon with the laser scanner 252 sits). In one embodiment, the measuring head 254 includes a gimbal point that is a center of rotation about the vertical axis and a horizontal axis. The measuring head 254 has a rotary mirror 258, which may be rotated about the horizontal axis. The rotation about the vertical axis may be about the center of the base 24. In the exemplary embodiment, the vertical axis and the horizontal axis are perpendicular to each other. The terms azimuth axis and zenith axis may be substituted for the terms vertical axis and horizontal axis, respectively. The term pan axis or standing axis may also be used as an alternative to vertical axis.

The measuring head 254 is further provided with an electromagnetic radiation emitter, such as light emitter 260, for example, that emits an emitted light beam 30. In one embodiment, the emitted light beam is a coherent light beam such as a laser beam. The laser beam may have a wavelength range of approximately 300 to 1600 nanometers, for example 790 nanometers, 905 nanometers, 1550 nm, or less than 400 nanometers. It should be appreciated that other electromagnetic radiation beams having greater or smaller wavelengths may also be used. The emitted light beam is amplitude or intensity modulated, for example, with a sinusoidal waveform or with a rectangular waveform. The emitted light beam is emitted by the light emitter 260 onto the rotary mirror 258, where it is deflected to the environment. A reflected light beam is reflected from the environment by an object (e.g. a surface in the environment). The reflected or scattered light is intercepted by the rotary mirror 258 and directed into a light receiver 262. The directions of the emitted light beam and the reflected light beam result from the angular positions of the rotary mirror 258 and the measuring head 254 about the vertical and horizontal axes, respectively. These angular positions in turn depend on the corresponding rotary drives or motors.

Coupled to the light emitter 260 and the light receiver 262 is a controller 264. The controller 264 determines, for a multitude of measuring points, a corresponding number of distances between the laser scanner 252 and the points on object. The distance to a particular point is determined based at least in part on the speed of light in air through which electromagnetic radiation propagates from the device to the object point. In one embodiment the phase shift of modulation in light emitted by the laser scanner 20 and the point is determined and evaluated to obtain a measured distance.

The controller 264 may include a processor system that has one or more processing elements. It should be appreciated that while the controller 264 is illustrated as being integral with the housing of the laser scanner 252, in other embodiments, the processor system may be distributed between a local processor, an external computer, and a cloud-based computer. The processors may be microprocessors, field programmable gate arrays (FPGAs), digital signal processors (DSPs), and generally any device capable of performing computing functions. The one or more processors have access to memory for storing information. In an embodiment the controller 264 represents one or more processors distributed throughout the laser scanner 252.

The controller 264 may also include communications circuits, such as an IEEE 802.11 (Wi-Fi) module that allows the controller 264 to communicate through the network connection, such as with a remote computer, a cloud based computer, the 2D scanner 30 or other laser scanners 252.

The speed of light in air depends on the properties of the air such as the air temperature, barometric pressure, relative humidity, and concentration of carbon dioxide. Such air properties influence the index of refraction n of the air. The speed of light in air is equal to the speed of light in vacuum c divided by the index of refraction. In other words, $c_{air}=c/n$. A laser scanner of the type discussed herein is based on the time-of-flight (TOF) of the light in the air (the round-trip time for the light to travel from the device to the object and back to the device). Examples of TOF scanners include scanners that measure round trip time using the time interval between emitted and returning pulses (pulsed TOF scanners), scanners that modulate light sinusoidally and measure phase shift of the returning light (phase-based scanners), as well as many other types. A method of measuring distance based on the time-of-flight of light depends on the speed of light in air and is therefore easily distinguished from methods of measuring distance based on triangulation. Triangulation-based methods involve projecting light from a light source along a particular direction and then intercepting the light on a camera pixel along a particular direction. By knowing the distance between the camera and the projector and by matching a projected angle with a received angle, the method of triangulation enables the distance to the object to be determined based on one known length and two known angles of a triangle. The method of triangulation, therefore, does not directly depend on the speed of light in air.

The measuring head 254 may include a display device 266 integrated into the laser scanner 252. The display device 266 may include a graphical touch screen, as shown in FIG. 23, which allows the operator to set the parameters or initiate the operation of the laser scanner 252. For example, the screen may have a user interface that allows the operator to provide measurement instructions to the device, and the screen may also display measurement results.

In an embodiment, the base 256 is coupled to a swivel assembly (not shown) such as that described in commonly owned U.S. Pat. No. 8,705,012, which is incorporated by reference herein. The swivel assembly is housed within the carrying structure and includes a motor that is configured to rotate the measuring head 254 about the vertical axis.

In the exemplary embodiment, the base 256 is mounted on a frame 268, such as a tripod for example. The frame 268 may include a movable platform 270 that includes a plurality of wheels 272. As will be described in more detail herein, the movable platform 270 allow the laser scanner 252 to be quickly and easily moved about the environment that is being scanned, typically along a floor that is approximately horizontal. In an embodiment, the wheels 272 may be locked in place using wheel brakes as is known in the art. In another embodiment, the wheels 272 are retractable, enabling the tripod to sit stably on three feet attached to the tripod. In another embodiment, the tripod has no wheels but is simply pushed or pulled along a surface that is approximately horizontal, for example, a floor. In another embodiment, the optional moveable platform 270 is a wheeled cart that may be hand pushed/pulled or motorized.

In this embodiment, the 2D scanner 30 and the laser scanner 252 each have a position indicator 274, 277 respectively. As is discussed in more detail with respect to FIGS. 25, 28 and 29, the position indicators may be a radio frequency identification system (RFID), an near field communications system (FIG. 25), a magnetic switch system (FIG. 28), a feature or keying arrangement or a machine readable indicia system (FIG. 29). The position indicators 274, 277, when engaged, allow the system 250 to determine and record the position of the 2D scanner 30 relative to the laser scanner 252. Once the 2D scanner 30 is registered relative to the laser scanner 252, the 2D coordinate measurement data acquired by the 2D scanner 30 may be transformed from a local coordinate frame of reference to a laser scanner coordinate frame of reference. It should be appreciated that this allows the combining of the coordinate data from the 2D scanner 30 and the laser scanner 252.

Figure 25:
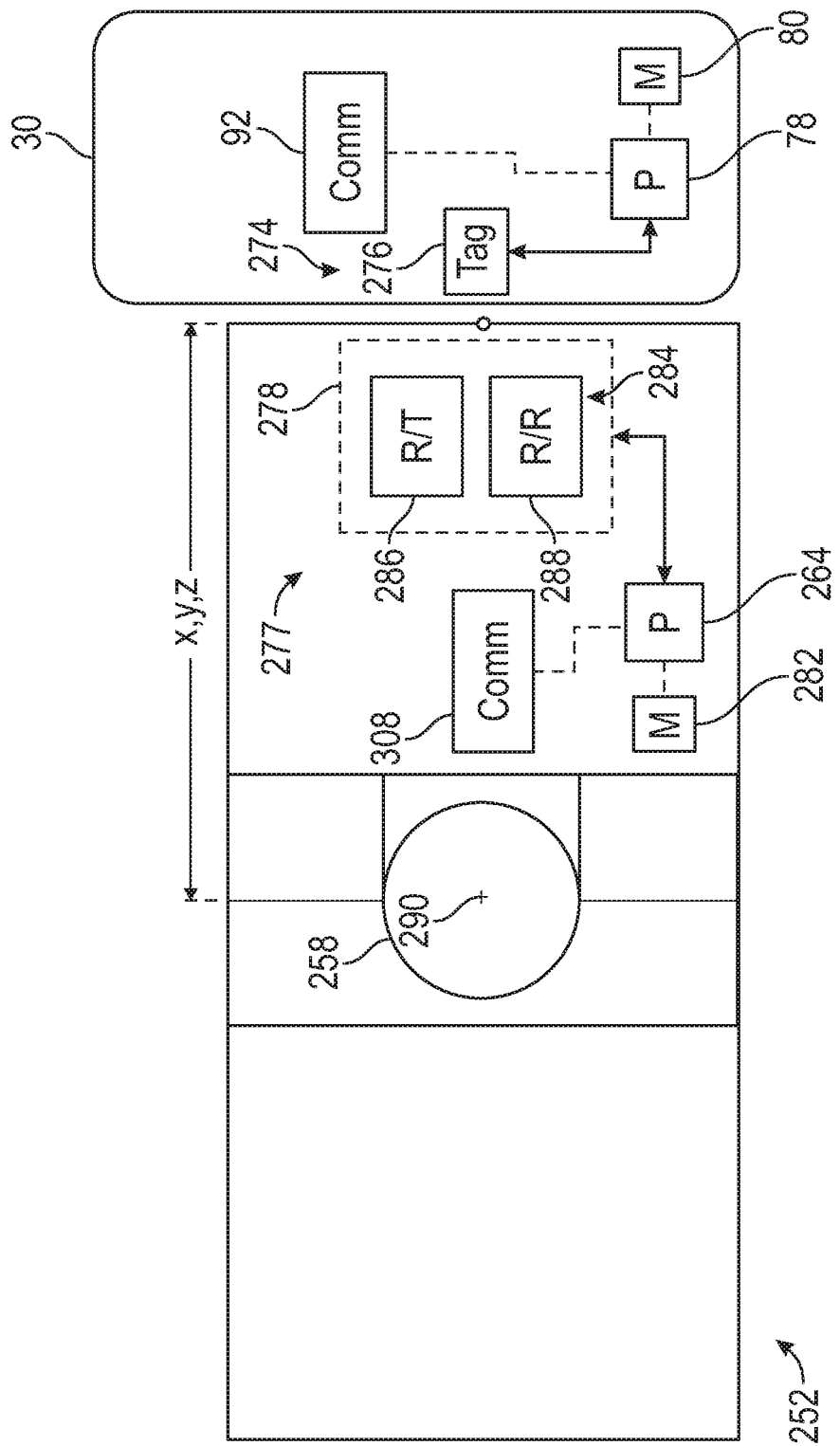
FIG. 25 is a schematic illustration of a laser scanner and hand scanner for the system of FIG. 23.

Referring now to FIG. 25, with continuing reference to FIG. 24 and FIG. 25, an embodiment is shown of the system 250 using near field communications (NFC) for the position indicators 274, 277. A near field communications system typically consists of a tag 276 and a reader 278. The tag 276 and reader 278 are typically coupled to separate devices or objects and when brought within a predetermined distance of each other, cooperate to transfer data therebetween. It should be appreciated that while embodiments herein describe the tag 276 as being mounted within or coupled to the body of the 2D scanner 30 and the reader 278 as being disposed within the housing of the laser scanner 252, this is for exemplary purposes and the claims should not be so limited. In other embodiments, the arrangement of the tag 276 and reader 278 may be reversed.

As used herein, the term "near field communications" (NFC) refers to a communications system that allows for wireless communications between two devices over a short or close range, typically less than 5 inches (127 millimeters). NFC further provides advantages in that communications may be established, and data exchanged, between the NFC tag 276 and the reader 278 without the NFC tag 276 having a power source such as a battery. To provide the electrical power for operation of the NFC tag 276, the reader 278 emits a radio frequency (RF) field (the Operating Field). Once the NFC tag 276 is moved within the operating field, the NFC tag 276 and reader 278 are inductively coupled, causing current flow through an NFC tag antenna. The generation of electrical current via inductive coupling provides the electrical power to operate the NFC tag 276 and establish communication between the tag and reader, such as through load modulation of the Operating Field by the NFC tag 276. The modulation may be direct modulation, frequency-shift keying (FSK) modulation or phase modulation, for example. In one embodiment, the transmission frequency of the communication is 13.56 megahertz with a data rate of 106-424 kilobits per second.

In an embodiment, the 2D scanner 30 includes a position indicator 274 that includes the NFC tag 276. The NFC tag 276 may be coupled at a predetermined location of the body of the 2D scanner 30. In an embodiment, the NFC tag 276 is coupled to the side of the 2D scanner 30 to facilitate the operator 280 placing the NFC tag 276 adjacent the laser scanner 252 (FIG. 24). In an embodiment, the NFC tag 276 is coupled to communicate with the processor 78. In other embodiments, the NFC tag 276 is a passive device that is not electrically coupled to other components of the 2D scanner 30. In the exemplary embodiment, the NFC tag 276 includes data stored thereon, the data may include but is not limited to identification data that allows the 2D scanner 30 to be uniquely identified (e.g. a serial number) or a communications address that allows the laser scanner 252 to connect for communications with the 2D scanner 30.

In one embodiment, the NFC tag 276 includes a logic circuit that may include one or more logical circuits for executing one or more functions or steps in response to a signal from an antenna. It should be appreciated that logic circuit may be any type of circuit (digital or analog) that is capable of performing one or more steps or functions in response to the signal from the antenna. In one embodiment, the logic circuit may further be coupled to one or more tag memory devices configured to store information that may be accessed by logic circuit. NFC tags may be configured to read and write many times from memory (read/write mode) or may be configured to write only once and read many times from tag memory (card emulation mode). For example, where only static instrument configuration data is stored in tag memory, the NFC tag may be configured in card emulation mode to transmit the configuration data in response to the reader 278 being brought within range of the tag antenna.

In addition to the circuits/components discussed above, in one embodiment the NFC tag 276 may also include a power rectifier/regulator circuit, a clock extractor circuit, and a modulator circuit. The operating field induces a small alternating current (AC) in the antenna when the reader 278 is brought within range of the tag 276. The power rectifier and regulator converts the AC to stable DC and uses it to power the NFC tag 276, which immediately "wakes up" or initiates operation. The clock extractor separates the clock pulses from the operating field and uses the pulses to synchronize the logic, memory, and modulator sections of the NFC tag 276 with the NFC reader 278. The logic circuit separates the 1's and 0's from the operating field and compares the data stream with its internal logic to determine what response, if any, is required. If the logic circuit determines that the data stream is valid, it accesses the memory section for stored data. The logic circuit encodes the data using the clock extractor pulses. The encoded data stream is input into the modulator section. The modulator mixes the data stream with the operating field by electronically adjusting the reflectivity of the antenna at the data stream rate. Electronically adjusting the antenna characteristics to reflect RF is referred to as backscatter. Backscatter is a commonly used modulation scheme for modulating data on to an RF carrier. In this method of modulation, the tag coil (load) is shunted depending on the bit sequence received. This in turn modulates the RF carrier amplitude. The NFC reader detects the changes in the modulated carrier and recovers the data.

In an embodiment, the NFC tag 276 is a dual-interface NFC tag, such as M24SR series NFC tags manufactured by ST Microelectronics N.V. for example. A dual-interface memory device includes a wireless port that communicates with an external NFC reader, and a wired port that connects the device with another circuit, such as processor 78. The wired port may be coupled to transmit and receive signals from the processor 78 for example. In another embodiment, the NFC tag 276 is a single port NFC tag, such as MIFARE Classic Series manufactured by NXP Semiconductors. With a single port tag, the tag 276 is not electrically coupled to the processor 78.

It should be appreciated that while embodiments herein disclose the operation of the NFC tag 276 in a passive mode, meaning an initiator/reader device provides an operating field and the NFC tag 276 responds by modulating the existing field, this is for exemplary purposes and the claimed invention should not be so limited. In other embodiments, the NFC tag 276 may operate in an active mode, meaning that the NFC tag 276 and the reader 278 may each generate their own operating field. In an active mode, communication is performed by the NFC tag 276 and reader 278 alternately generating an operating field. When one of the NFC tag and reader device is waiting for data, its operating field is deactivated. In an active mode of operation, both the NFC tag and the reader device may have its own power supply.

In an embodiment, the reader 278 is disposed within the housing of the laser scanner 252. The reader 278 includes, or is coupled to a processor, such as processor 264 coupled to one or more memory modules 282. The processor 264 may include one or more logical circuits for executing computer instructions. Coupled to the processor 560 is an NFC radio 284. The NFC radio 284 includes a transmitter 286 that transmits an RF field (the operating field) that induces electric current in the NFC tag 276. Where the NFC tag 276 operates in a read/write mode, the transmitter 286 may be configured to transmit signals, such as commands or data for example, to the NFC tag 276.

The NFC radio 284 may further include a receiver 288. The receiver 288 is configured to receive signals from, or detect load modulation of, the operating field by the NFC tag 276 and to transmit signals to the processor 264. Further, while the transmitter 286 and receiver 288 are illustrated as separate circuits, this is for exemplary purposes and the claimed invention should not be so limited. In other embodiments, the transmitter 286 and receiver 284 may be integrated into a single module. The antennas being configured to transmit and receive signals in the 13.56 megahertz frequency.

As is discussed in more detail herein, when the 2D scanner 30 is positioned relative to the laser scanner 252, the tag 276 may be activated by the reader 278. Thus, the position of the 2D scanner 30 relative to the laser scanner 252 will be generally known due to the short transmission distances provided by NFC. It should be appreciated that since the position of the tag 276 is known, and the position of the reader 278 is known, this allows the transforming of coordinates in the 2D scanner coordinate frame of reference into the laser scanner coordinate frame of reference (e.g. the reference frame having an origin at the gimbal location 290).

Terms such as processor, controller, computer, DSP, FPGA are understood in this document to mean a computing device that may be located within the system 30 instrument, distributed in multiple elements throughout the system, or placed external to the system (e.g. a mobile computing device).

Figure 26:
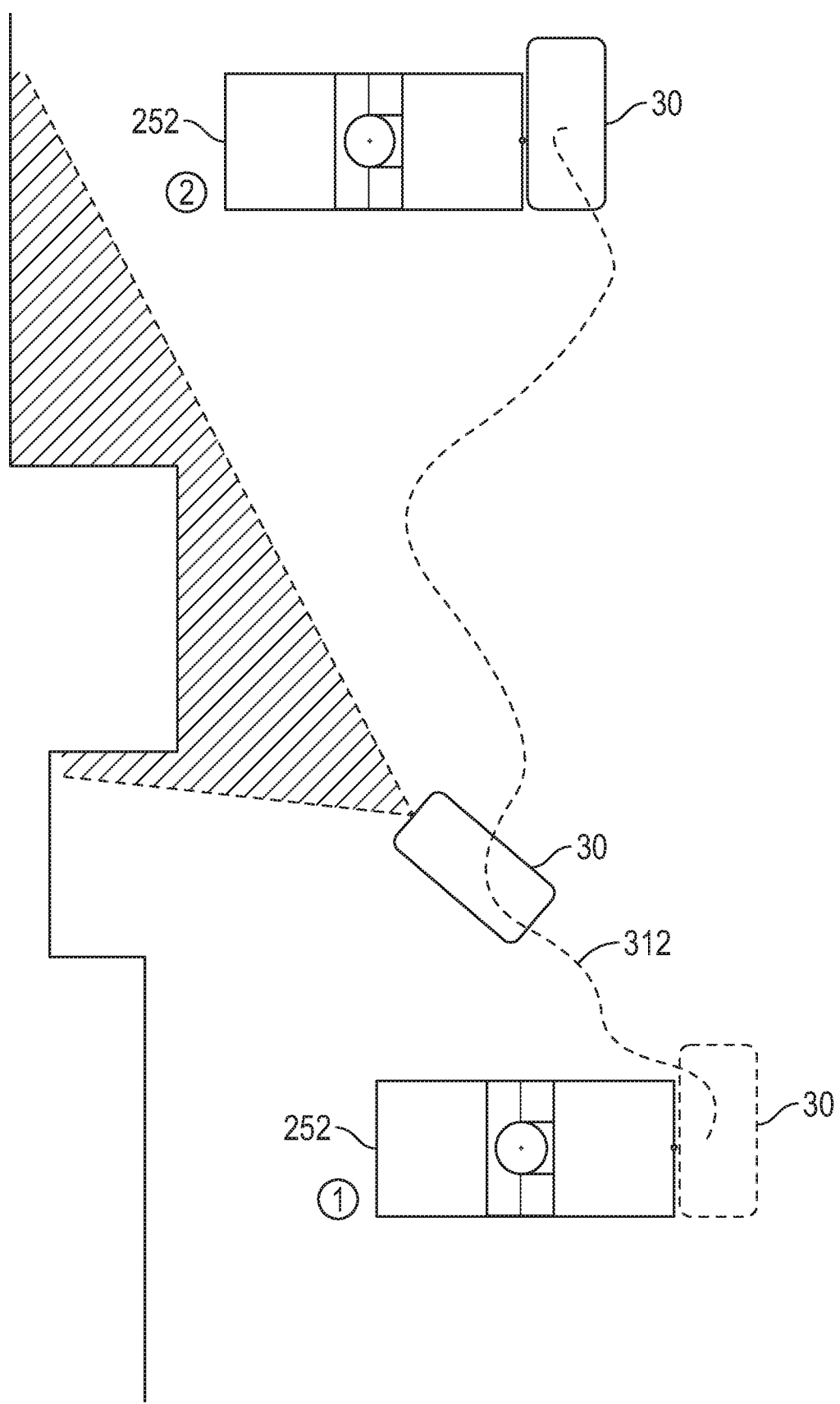
FIG. 26 is a schematic illustration of the operation of the system of FIG. 23.
Figure 27:
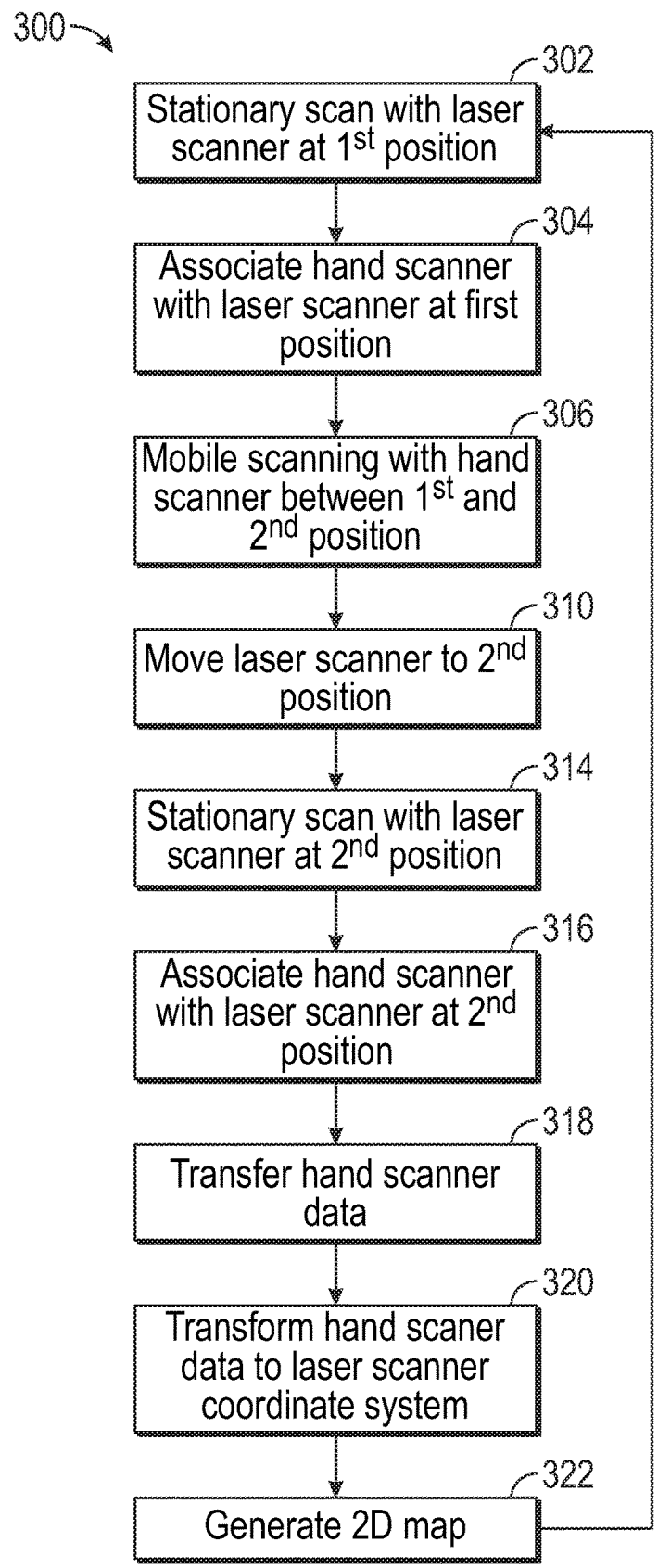
FIG. 27 is a flow diagram of a method of operating the system of FIG. 23.

Referring now to FIGS. 26-27, with continuing reference to FIGS. 23-25, a method 300 is shown of the operation of the system 250. The method 300 begins in block 302 with the laser scanner 252 performing a scan at a first position. During the scan at the first position (location "1" of FIG. 26), the laser scanner 252 acquires 3D coordinates for a first plurality of points on surfaces in the environment being scanned. The method 300 then proceeds to block 304 where the 2D scanner 30 is moved adjacent the laser scanner 252 such that the position indicator 274 engages the position indicator 277. In the embodiment of FIG. 25, the placement of the tag 276 within range of the reader 278 allows data to be transferred from the 2D scanner 30 to the laser scanner 252. In an embodiment, the transferred data includes an identification data of the 2D scanner 30. This registers the position and orientation of the 2D scanner 30 relative to the laser scanner 252 at the first position. Once the 2D scanner 30 is registered to the laser scanner 252, the method 300 then proceeds to block 306 where the 2D scanner 30 is activates. In one embodiment, the 2D scanner 30 is automatically activated by the registration, such as via a signal from the laser scanner communications circuit 308 to the 2D scanner communications circuit 92 or via NFC. In an embodiment, the 2D scanner 30 continuously scans until the laser scanner 252 and the 2D scanner 30 are registered a second time.

In block 306, the operator 280 scans the environment by moving the 2D scanner 30 along a path 312. The 2D scanner acquires 2D coordinate data of the environment as it is moved along the path 312 in the manner described herein with respect to FIGS. 10-13 with the movement of the 2D scanner being determined based on IMU 74 (FIG. 9). It should be appreciated that the 2D coordinate data is generated in a local coordinate frame of reference of the 2D scanner 30.

The method 300 then proceeds to block 310 where the laser scanner 252 is moved from the first position to a second position (e.g. location "2" of FIG. 26). The method 300 then proceeds to block 314 where a second scan of the environment is performed by the laser scanner 252 to acquire the 3D coordinates of a second plurality of points on surfaces in the environment being scanned. Based at least in part on the first plurality of points acquired in the first scan by laser scanner 252 in block 302 and the second plurality of points acquired in the second scan by laser scanner 252 in block 314, a correspondence between registration targets may be determined. In the exemplary embodiment, the registration targets are based on natural features in the environment that are common to both the first and second plurality of points. In other embodiments, artificial targets may be manually placed in the environment for use in registration. In an embodiment, a combination of natural features and artificial targets are used for registration targets.

It should be appreciated that once the registration targets are identified, the location of the laser scanner 252 (and the origin of the laser scanner frame of reference, e.g. gimbal point 290) in the second position relative to the first position is known with a high level of accuracy. In an embodiment, the accuracy of the laser scanner 252 between the first position and the second position may be between 1 mm-6 cm depending on the environment. In an embodiment, a registered 3D collection of points is generated based on a correspondence among registration targets, the 3D coordinates of the first collection of points, and the 3D coordinates of the second collection of points.

The method 300 then proceeds to block 316 where the 2D scanner 30 is once again moved adjacent the laser scanner 252 (now in the second position) to engage the position indicator 274 and position indicator 277. The engagement of the position indicators 274, 277, registers the position and orientation of the 2D scanner 30 relative to the laser scanner 252. In an embodiment, this second registration of the 2D scanner 30 causes the 2D scanner 30 to stop scanning. In an embodiment, blocks 314, 316 are reversed and the registration of the 2D scanner 30 causes the laser scanner to automatically perform the second scan of block 314.

With the 2D scanner 30 registered, the method 300 then proceeds to block 318 where the 2D coordinate data acquired by 2D scanner 30 is transferred. In an embodiment, the 2D coordinate data is transferred. In one embodiment, the 2D coordinate data is transferred to the laser scanner 30. In another embodiment, the 2D coordinate data is transferred to one or more external or remotely located computers along with the registered 3D collection of points.

The method 300 then proceeds to block 320 where the transferred 2D coordinate data is transformed from the 2D scanner local coordinate frame of reference to the laser scanner coordinate frame of reference. It should be appreciated that with the 2D coordinate data in the laser scanner coordinate frame of reference, the 2D coordinate data may be adjusted as the initial position (e.g. the first position of laser scanner 252) and the final position (e.g. the second position of laser scanner 252) are known with a high degree of accuracy. This provides advantages in improving the accuracy of the 2D coordinate data with the flexibility of a handheld 2D scanner.

With the 2D coordinate data transformed into the laser scanner coordinate frame of reference, the method 300 then proceeds to block 322 where a 2D map of the environment is generated based at least in part on the transformed 2D coordinate data and the registered 3D collection of points. It should be appreciated that in some embodiments, the method 300 may then loop back to block 306 and additional scanning is performed. The scan performed by the laser scanner at the second position then becomes the effective first position for the subsequent execution of method 300. It should further be appreciated that while the method 300 is shown as a series of sequential steps, in other embodiments, some of the blocks of method 300 may be performed in parallel.

Figure 28:
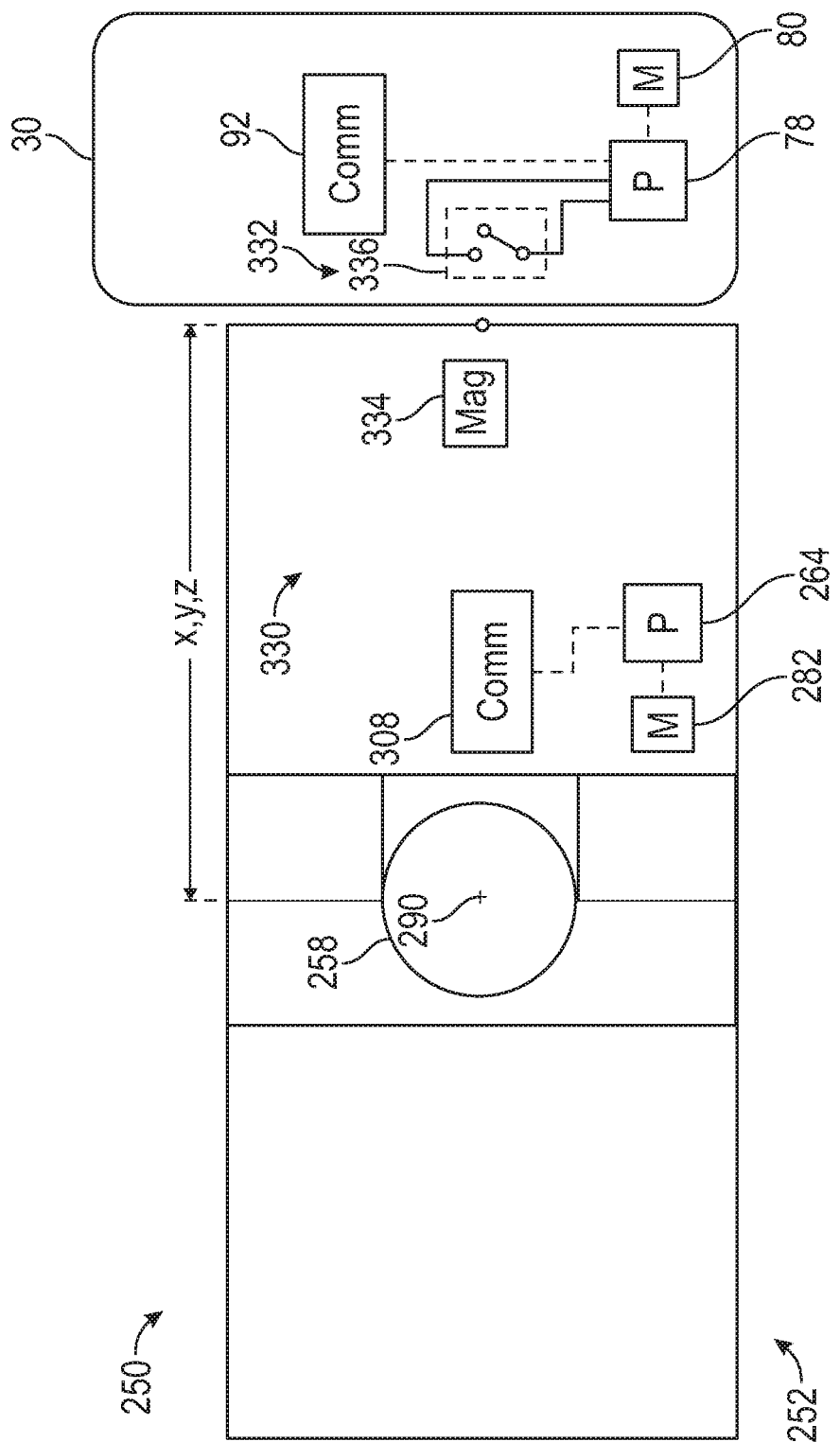
FIG. 28 is a schematic illustration of a laser scanner and a hand scanner in accordance with another embodiment.
Figure 29:
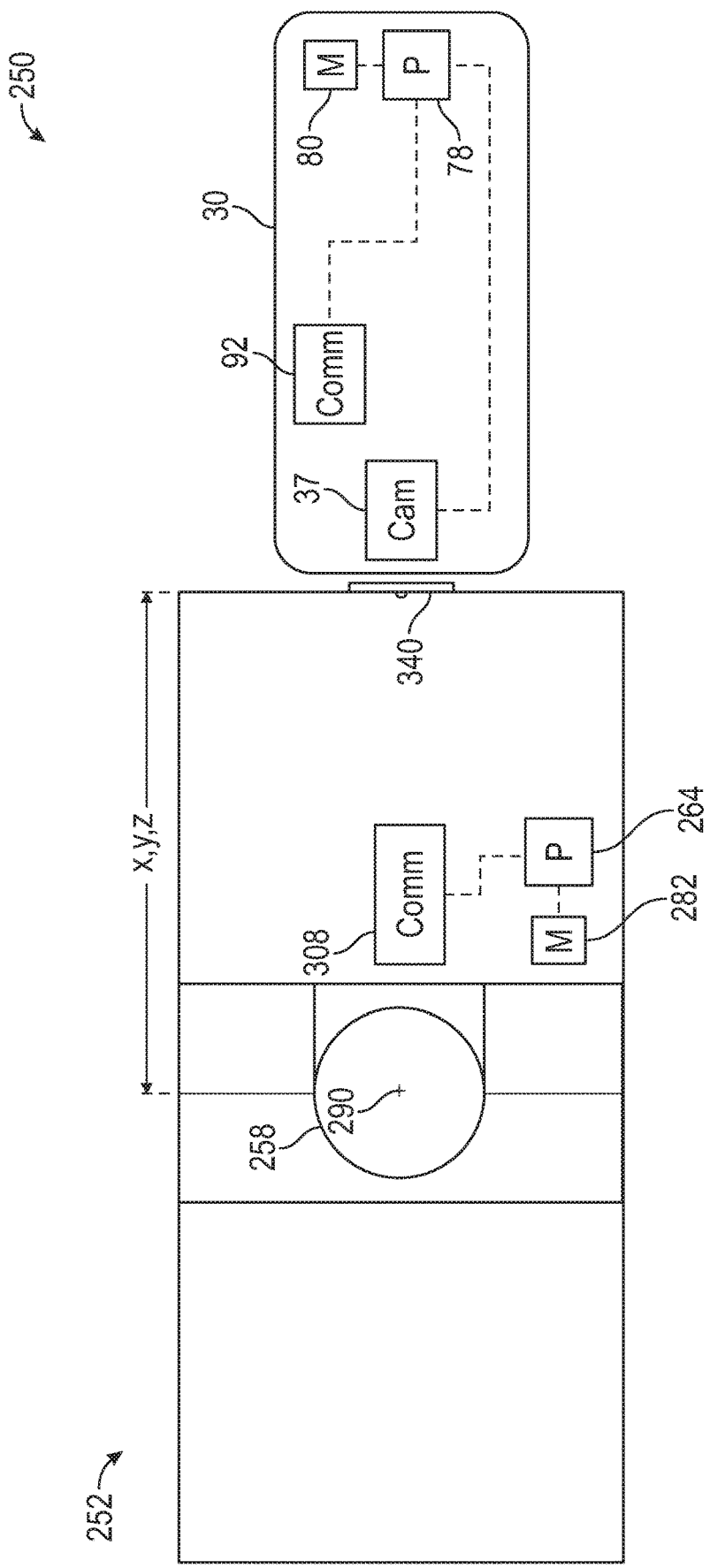
FIG. 29 is a schematic illustration of a laser scanner and a hand scanner in accordance with another embodiment.

Referring now to FIG. 28, another embodiment of the system 250 with the laser tracker 252 and the 2D scanner 30 having position indicators 330, 332 respectively. In this embodiment, the position indicator 330 of the laser scanner 252 is a magnetic member 334. The magnet 334 is disposed within or on the body of the laser scanner 252 and generates a sufficient magnetic field to change the state (e.g. from open to closed) of a switch 336 when the 2D scanner 30 is adjacent the laser scanner 252.

The 2D scanner 30 includes a position indicator 332 that includes the magnetically actuated switch 336, which is electrically coupled to the processor 78. In the illustrated embodiment, when the side of the body of the 2D scanner 30 is placed against the side of the housing of the laser scanner 252 with the magnet 334 aligned with switch 336, the position indicators 330, 332 are engaged. In an embodiment, the laser scanner housing and the body of the 2D scanner may have markings or indicia (e.g. lines or arrows) that provide a visual guide to the operator and assist with the alignment.

In an embodiment, the processor 78 detects the change of state of the switch 336. The processor 78 then transmits a signal via communications module 92 to the laser scanner 252. The laser scanner 252 receives the signal via communications module 308 and processor 264 initiates operation of the laser scanner 252. Similarly, in an embodiment the detecting of the change of state of switch 336 causes the 2D scanner 30 to initiate operation. The 2D scanner 30 and laser scanner 252 are then operated as described herein with respect to method 300. It should be appreciated that the positions of the magnet 334 and the switch 336 may be reversed (e.g. the switch is located in the laser scanner 252).

Referring now to FIG. 29, another embodiment is shown of the system 250 with the laser tracker 252 having position indicator 340. In this embodiment, the position indicator 340 of the laser scanner 252 is a machine readable symbol, such as but not limited to a QR code (i.e. a matrix bar-code compliant with ISO/ISC 18004:2015) or a bar-code (i.e. compliant with ISO/IEC 15416 or ANSI/UCC5) for example. The position indicator 340 may be a label with an adhesive back that is adhered to the housing of the laser scanner 252 at a predetermined position.

In this embodiment, to register the 2D scanner 30 to the laser scanner 252, the operator aligns the 2D scanner 30 so that the camera 37 is facing the position indicator 340 as illustrated in FIG. 29. When the 2D scanner 30 and the camera 37 are aligned, the operator may actuate an actuator, such as actuator 38 (FIG. 2) for example, to acquire an image of the position indicator 340 with the color camera 37. In this embodiment, when the laser scanner 252 and the 2D scanner 30 are so aligned this allows the camera 37 to engage the position indicator 340. From the acquired image, the processor 78 can decode or translate the information stored in the position indicator 340. The information included in the machine readable symbol on the position indicator 340 includes information that allows the 2D scanner 30 to connect via communications module 92 to the laser scanner 252 (via communications module 308). The machine readable symbol information may include, but it not limited to: a serial number, an identification code, a user-defined name, a web address, a network address, a media access control (MAC) address, a password for connecting with the laser scanner 252, or a combination of the foregoing.

Once the processor 78 decodes the machine readable symbol on the position indicator 340, the processor 78 communicates with the laser scanner 252 to register the 2D scanner 30 to the laser scanner 252. It should be appreciated that since the camera 37 and the position indicator 340 are aligned, the laser scanner can determine the position, or at least the approximate position of the 2D scanner. Thus, when the 2D scan data is transferred from the 2D scanner 30, the 2D scan data may be transformed into the laser scanner coordinate frame of reference as described herein with reference to method 300.

Figure 30:
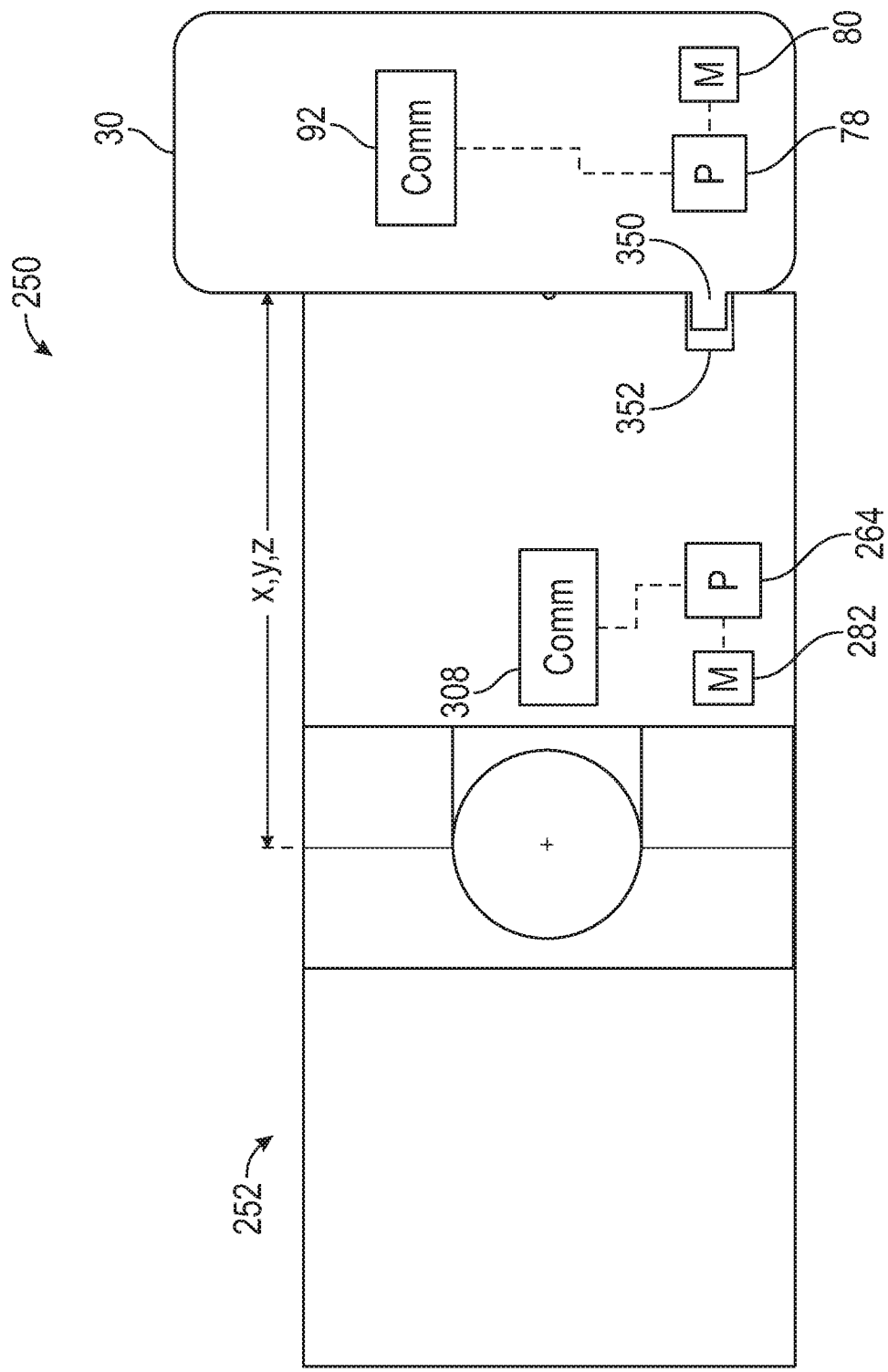
FIG. 30 is a schematic illustration of a mobile mapping system using a hand scanner with multiple laser scanners in accordance with another embodiment.

In still another embodiment shown in FIG. 30, the registration of the 2D scanner 30 to the laser scanner 252 may be performed using mechanical elements. In this embodiment, the 2D scanner 30 includes an element, such as pin 350 for example, on the body of the 2D scanner 30. The element 350 is at a known predetermined position relative to the 2D scanner coordinate frame of reference. The element 350 engages and cooperates with an element on the laser scanner 252, such as hole 352 for example, such that when the elements 350, 352 are engaged, a mathematical relationship may be determined between the 2D scanner coordinate frame of reference and the laser scanner coordinate frame of reference that allows the 2D scan data to be transformed into the laser scanner coordinate frame of reference.

It should be appreciated that while the illustrated embodiment shows the elements 350, 352 as a pin and a hole, this is for exemplary reasons and the claims should not be so limited. In other embodiments, other element shapes may be used, such as for example, projections and recesses. Further, the element 350 may be arranged on any surface or side of the 2D scanner that allows the element 350 to engage element 352. Further, the element 352 may be arranged on any side of the housing of the laser scanner 252. For example, the element 352 may be on a top surface of the laser scanner housing and the element 350 may be on a lower or bottom surface of the 2D scanner body. In still further embodiments, multiple elements 350, 352 may be provided that are each engaged with each other during the registration process.

In operation, the operator would align the 2D scanner 30 with the laser scanner 252 and engage the elements 350, 352. With the elements 350, 352 engaged, the operator actuates an actuator, such as actuator 38 for example, to begin the registration process. The process 78 then transmits a signal via the communications module 92 to the laser scanner 252 that is received by process 264 (i.e. via communications module 308) to register the 2D scanner 30 to the laser scanner 252. In this way, the 2D scan data from the 2D scanner 30 may be transformed into the laser scanner coordinate frame of reference in the manner described herein with respect to method 300.

It should be appreciated that in some embodiments, the systems 250 illustrated in FIG. 25 and FIGS. 28-30 may be combined. For example, the NFC system of FIG. 25, or the magnetic switch of FIG. 28 may include mechanical elements 350, 352 to assist with positioning of the 2D scanner 30.

Figure 31:
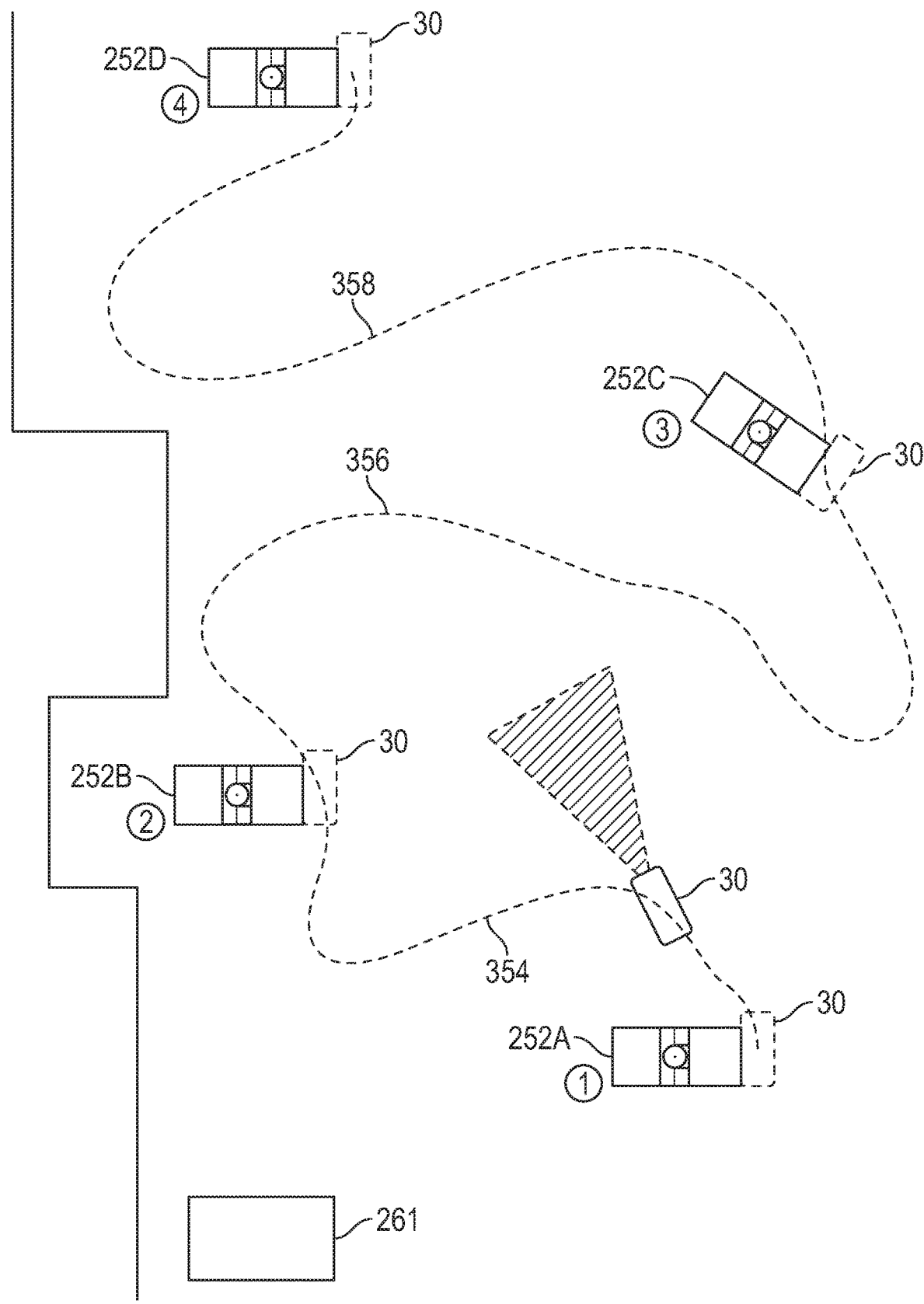
FIG. 31 is a schematic illustration of a use and path of a scanner in accordance with an embodiment of the present disclosure.

Referring now to FIG. 31, in an embodiment the 2D scanner 30 may be used with multiple laser scanners 252A-252D. In this embodiment, the 2D scanner 30 is registered at a first laser scanner 252A at a first position. The 2D scanner 30 is moved along a desired path 354 to a second position where a second laser scanner 252B is located. The 2D scanner 30 is then registered to the second laser scanner 252B. In an embodiment, the laser scanner 252B initiates scanning of the environment when the registration is performed. The operator then continues scanning with the 2D scanner 30 along path 356 to a third position where a third laser scanner 252C is position. The process of registering the 2D scanner 30 to the laser scanner 252C is performed as described herein. The operator then continues scanner with the 2D scanner 30 along a path 358 to a fourth position where a fourth laser scanner 252D is positioned. The 2D scanner 30 is then registered to the laser scanner 252D. It should be appreciated that the use of four laser scanners is exemplary and the system 250 may use more or fewer laser scanners 30. Further, in other embodiments, multiple 2D scanners 30 may be used for scanning the environment and are each registered to one or more laser scanners 252A-252D.

In an embodiment, the laser scanners 252A-252D are each connected for communication to a remote computer system 261, such as by a local area network for example. The 3D scan data from the laser scanners 252A-252D and the 2D scan data from the 2D scanner 30 may be transmitted to the computer 261 where the 3D scan data and the 2D scan data are transformed into a global coordinate frame of reference.

Figure 32:
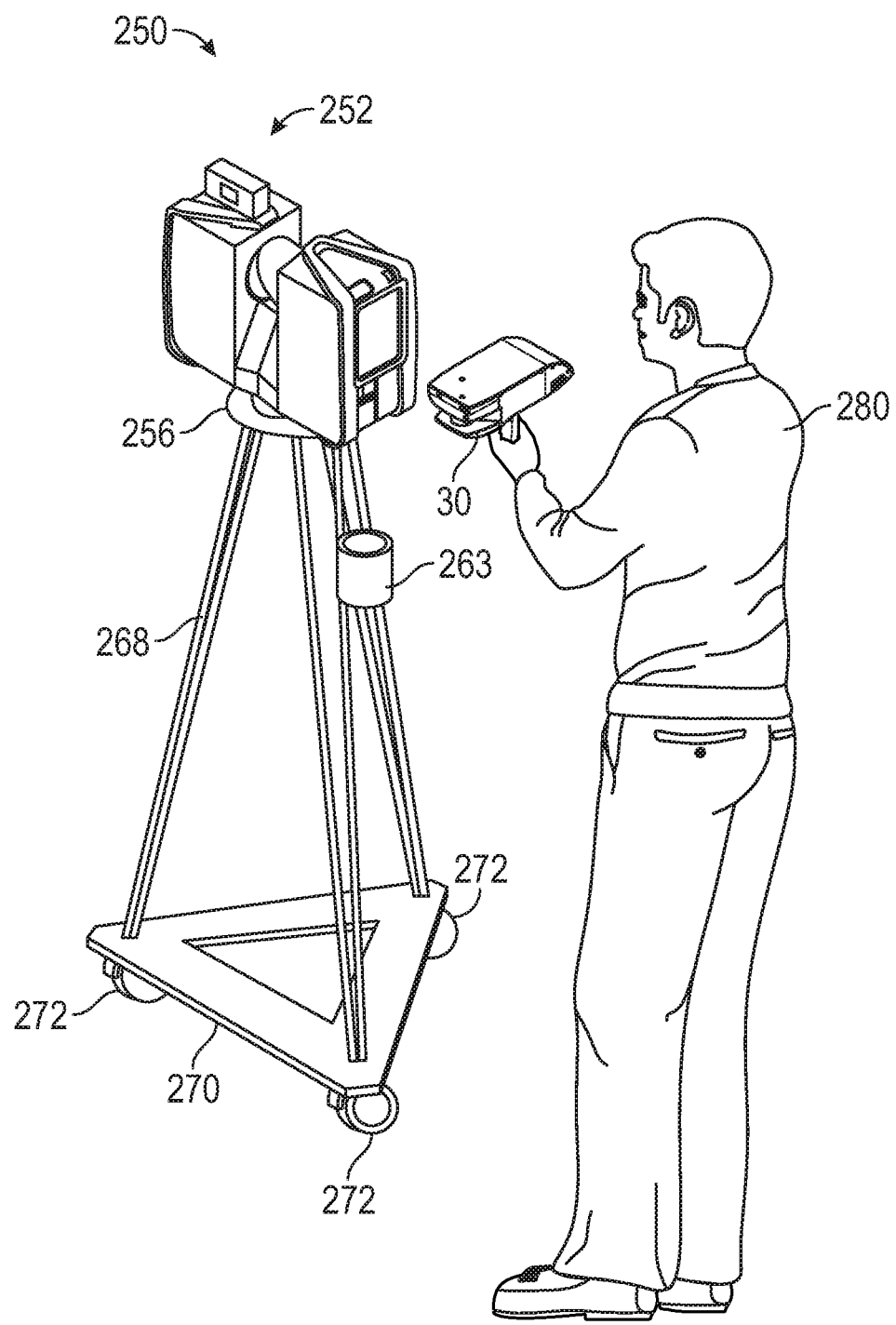
FIGS. 32-33 are perspective views of a mobile mapping system having a coupler for mounting the hand scanner to the laser scanner in accordance with another embodiment.
Figure 33:
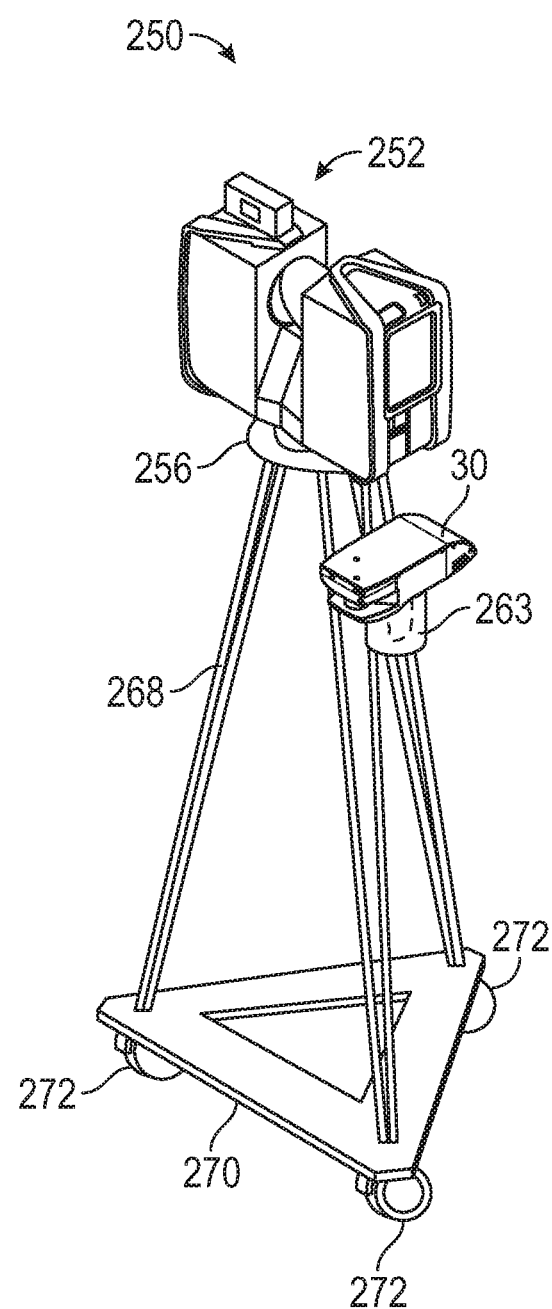

Referring now to FIG. 32 and FIG. 33 another embodiment of system 250 is shown. In this embodiment, a holder 263 is coupled in a fixed relationship to the laser scanner 252. It should be appreciated that while the illustrated embodiment shows the holder 263 as being coupled to the frame 268, this is for exemplary reasons and in other embodiments, the holder 263 may be coupled to other components, such as but not limited to the platform 270, the housing of the laser scanner 252, or the base 256 for example.

In an embodiment, the holder 263 includes a means for holding the 2D scanner 30 in a fixed relationship to the coordinate frame of reference of the laser scanner 30 (e.g. the gimbal point 290). In an embodiment, the means holds the 2D laser scanner such that the 2D scanner 30 coordinate frame of reference is fixed in six degrees of freedom relative to the coordinate frame of reference of the laser scanner 252. In an embodiment, the holder 263 may include a cavity that is sized and shaped to receive the handle portion 36. In another embodiment, the holder 263 may include a clamping mechanism that is operable to couple with the handle 36 or the body 34.

In operation, the operator 280 registers the 2D scanner 30 to the laser scanner 252 and then couples the 2D scanner 30 to the holder 263. The system 250 is then moved (such as on wheels 272) about the environment to perform the 2D scan using the 2D scanner 30. When the operator reaches the second position (as described in reference to method 300), the operator removes the 2D scanner 30 from the holder 263 and the operator 280 once again registers the 2D scanner 30 to the laser scanner 252. It should be appreciated that the operator 280 may lock the wheels 272 at the first position and second position while the laser scanner 252 performs the 3D scan. The 2D scan data from the 2D scanner 30 is transferred and transformed as described herein with reference to method 300.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed:

1. A system for generating a two-dimensional (2D) image of an environment, the system comprising:
   a measurement device configured to be moved to a plurality of registration positions in the environment, the measurement device having a 2D scanner and is sized and weighted to be carried by a single operator, the 2D scanner being configured to sweep a beam of light in a horizontal plane, wherein the plurality of registration positions includes a first registration position and a second registration position;
   wherein the measurement device is configured to obtain a first plurality of 2D scan sets using the 2D scanner while the measurement device moves from the first registration position to the second registration position, each of the first plurality of 2D scan sets being a set of 2D coordinates of points in the environment, each of the first plurality of 2D scan sets being collected by the 2D scanner at a different position relative to the first registration position;

wherein the measurement device is configured to determine a first translation value corresponding to a first translation direction, a second translation value corresponding to a second translation direction, a first rotation value corresponding to a first orientational axis, and a second rotation value corresponding to a second orientational axis, wherein the first translation value, the second translation value, the first rotation value, and the second rotation value are determined based at least in part on a determination of a change in movement or orientation of the measurement device;

a processor configured to generate a 2D image of the environment based at least in part on the plurality of 2D scans, the first translation value, the first translation direction, the second translation value, the second translation direction, the first rotation value, and the second rotation value, wherein generating the 2D image includes generating a grid map that includes a plurality of cells, each of the plurality of cells indicating a probability of a cell area being occupied;

wherein the measurement device comprises a housing having a body and a handle, the body having a first plane extending therethrough; and a haptic feedback device disposed within the handle and configured to generate haptic feedback in response to a signal indicating an orientation of the measurement device has crossed a variance threshold.

2. The system of claim 1, wherein the 2D scanner comprises a light source, an image sensor, and a controller, wherein the light source is configured to steer a beam of light within the first plane to illuminate object points in the environment, wherein the image sensor is configured to receive light reflected from the object points, and wherein the controller is configured to determine a distance value to at least one of the object points.

3. The system of claim 2, further comprising a portable computing device having a second image sensor, the portable computing device configured to communicate with the processor, wherein the processor is configured to merge a first image from the portable computing device into the 2D image of the environment in response to the image being acquired by the second image sensor, wherein a first position of the first image on the 2D image corresponding a second position in the environment where the first image is acquired.

4. The system of claim 1, further comprising a laser projector coupled to the measurement device, the laser projector having a second light source that emits in operation a visible beam of light in a second plane parallel to the first plane.

5. The system of claim 1, wherein the measurement device further comprises a three-dimensional camera that is operably coupled to the processor.

6. The system of claim 1, wherein the measurement device includes a first position indicator configured to interact with a remote device having a second position indicator.

7. The system of claim 6, wherein the first position indicator includes a near field communications tag and the second position indicator includes a near field communications transmitter and a near field communications receiver.

8. A system for generating a two-dimensional (2D) image of an environment, the system comprising:

a measurement device configured to be moved to a plurality of registration positions in the environment, the measurement device having a 2D scanner and is sized and weighted to be carried by a single operator, the 2D scanner being configured to sweep a beam of light in a horizontal plane, wherein the plurality of registration positions includes a first registration position and a second registration position;

wherein the measurement device is configured to obtain a first plurality of 2D scan sets using the 2D scanner while the measurement device moves from the first registration position to the second registration position, each of the first plurality of 2D scan sets being a set of 2D coordinates of points in the environment, each of the first plurality of 2D scan sets being collected by the 2D scanner at a different position relative to the first registration position;

wherein the measurement device is configured to determine a first translation value corresponding to a first translation direction, a second translation value corresponding to a second translation direction, a first rotation value corresponding to a first orientational axis, and a second rotation value corresponding to a second orientational axis, wherein the first translation value, the second translation value, the first rotation value, and the second rotation value are determined based at least in part on a determination of a change in movement or orientation of the measurement device;

a processor configured to generate a 2D image of the environment based at least in part on the plurality of 2D scans, the first translation value, the first translation direction, the second translation value, the second translation direction, the first rotation value, and the second rotation value, wherein generating the 2D image includes generating a grid map that includes a plurality of cells, each of the plurality of cells indicating a probability of a cell area being occupied;

wherein the measurement device includes a first position indicator configured to interact with a remote device having a second position indicator; and wherein the first position indicator includes a magnetically activated switch and the second position indicator includes a magnet.

9. A method for generating a two-dimensional (2D) image of an environment, the method comprising:

moving a measurement device to a plurality of registration positions in the environment, the measurement device having a 2D scanner and is sized and weighted to be carried by a single operator, the 2D scanner being configured to sweep a beam of light in a horizontal plane, wherein the plurality of registration positions includes a first registration position and a second registration position;

obtaining a first plurality of 2D scan sets using the 2D scanner while the measurement device moves from the first registration position to the second registration position, each of the first plurality of 2D scan sets being a set of 2D coordinates of points in the environment, each of the first plurality of 2D scan sets being collected by the 2D scanner at a different position relative to the first registration position;

determining a first translation value corresponding to a first translation direction, a second translation value corresponding to a second translation direction, a first rotation value corresponding to a first orientational axis, and a second rotation value corresponding to a second orientational axis, wherein the first translation value, the second translation value, the first rotation value, and the second rotation value are determined based at least in part on a determination of a change in movement or orientation of the measurement device;

generating a 2D image of the environment based at least in part on the plurality of 2D scans, the first translation value, the first translation direction, the second translation value, the second translation direction, the first rotation value, and the second rotation value, wherein generating the 2D image includes generating a grid map that includes a plurality of cells, each of the plurality of cells indicating a probability of a cell area being occupied; and actuating a haptic feedback device in the measurement device in response to the second rotation value crossing a predetermined threshold.

10. The method of claim 9, further comprising:
steering a beam of light to illuminate object points in the environment;
receiving light reflected from the object points; and
determining a distance value to at least one of the object points.

11. The method of claim 9, further comprising:
determining a position of the measurement device within the environment using a first position indicator of the measurement device that interacts with a second position indicator of a remote device.

12. A method for generating a two-dimensional (2D) image of an environment, the method comprising:
moving a measurement device to a plurality of registration positions in the environment, the measurement device having a 2D scanner and is sized and weighted to be carried by a single operator, the 2D scanner being configured to sweep a beam of light in a horizontal plane, wherein the plurality of registration positions includes a first registration position and a second registration position;

obtaining a first plurality of 2D scan sets using the 2D scanner while the measurement device moves from the first registration position to the second registration position, each of the first plurality of 2D scan sets being a set of 2D coordinates of points in the environment, each of the first plurality of 2D scan sets being collected by the 2D scanner at a different position relative to the first registration position;

determining a first translation value corresponding to a first translation direction, a second translation value corresponding to a second translation direction, a first rotation value corresponding to a first orientational axis, and a second rotation value corresponding to a second orientational axis, wherein the first translation value, the second translation value, the first rotation value, and the second rotation value are determined based at least in part on a determination of a change in movement or orientation of the measurement device;

generating a 2D image of the environment based at least in part on the plurality of 2D scans, the first translation value, the first translation direction, the second translation value, the second translation direction, the first rotation value, and the second rotation value, wherein generating the 2D image includes generating a grid map that includes a plurality of cells, each of the plurality of cells indicating a probability of a cell area being occupied; and emitting a visible laser light beam from a laser projector onto a point on an object, the laser projector being coupled to the measurement device;

measuring a distance from the measurement device to the point on the object using a three-dimensional camera coupled to the measurement device; and annotating the 2D image to include a position of the point on the object based at least in part on the distance.

13. The method of claim 12, further comprising:
scanning an area at the point on the object with the three-dimensional camera;
determining a scanning position and orientation of the measurement device when the area is being scanned;
generating a three-dimensional point cloud of the area; and
annotating the 2D image to include a linkage to the three-dimensional point cloud of the area, the annotation being positioned in the 2D image in a position corresponding to the position of the object in the area.

* * * * *